(12) United States Patent
Liu et al.

(10) Patent No.: US 12,063,808 B2
(45) Date of Patent: Aug. 13, 2024

(54) LIGHT-EMITTING SUBSTRATE AND METHOD OF MANUFACTURING THE SAME, AND LIGHT-EMITTING APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jun Liu, Beijing (CN); Jingang Fang, Beijing (CN); Yang Zhang, Beijing (CN); Tongshang Su, Beijing (CN); Wei He, Beijing (CN); Bin Zhou, Beijing (CN); Ning Liu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 443 days.

(21) Appl. No.: 17/393,661

(22) Filed: Aug. 4, 2021

(65) Prior Publication Data
US 2022/0069254 A1 Mar. 3, 2022

(30) Foreign Application Priority Data
Sep. 1, 2020 (CN) .......................... 202010906721.4

(51) Int. Cl.
*H10K 50/844* (2023.01)
*H10K 59/124* (2023.01)
(Continued)

(52) U.S. Cl.
CPC ......... *H10K 50/844* (2023.02); *H10K 59/124* (2023.02); *H10K 59/131* (2023.02);
(Continued)

(58) Field of Classification Search
None
See application file for complete search history.

(56) References Cited

U.S. PATENT DOCUMENTS

2016/0254473 A1 9/2016 Liu et al.
2017/0108173 A1* 4/2017 Kim .................... H01L 33/0033
(Continued)

FOREIGN PATENT DOCUMENTS

| CN | 102473849 A | * | 5/2012 | ......... H01L 51/5048 |
| CN | 102473850 A | * | 5/2012 | ............. C09K 11/02 |

(Continued)

OTHER PUBLICATIONS

Chinese First Office Action (w/ English translation) for corresponding CN Application No. 202010906721.4, 19 pages.

*Primary Examiner* — Michael Lebentritt
(74) *Attorney, Agent, or Firm* — Dority & Manning, P.A.

(57) ABSTRACT

A light-emitting substrate includes; a base, an isolation portion disposed on the base and located in an isolation region located outside a light-emitting region, and a second insulating pattern located in the light-emitting region. The isolation portion includes a first conductive pattern, a second conductive pattern and a first insulating pattern that are sequentially stacked on the base; an orthogonal projection of the first conductive pattern on the base is located within an orthogonal projection of the second conductive pattern on the base; and a side face of the first conductive pattern proximate to the light-emitting region and a corresponding side face of the second conductive pattern proximate to the light-emitting region have a first gap therebetween. A side face of the second insulating pattern proximate to the first insulating pattern and a side face of the first insulating pattern proximate to the second insulating pattern have a second gap therebetween.

17 Claims, 17 Drawing Sheets

(51) Int. Cl.
   *H10K 59/131*   (2023.01)
   *H10K 59/17*    (2023.01)
   *H10K 71/00*    (2023.01)
   *H10K 59/12*        (2023.01)

(52) U.S. Cl.
   CPC ............ *H10K 59/17* (2023.02); *H10K 71/00* (2023.02); *H10K 59/1201* (2023.02)

(56) References Cited

U.S. PATENT DOCUMENTS

| | | |
|---|---|---|
| 2020/0185468 A1 | 6/2020 | Zhang |
| 2020/0411615 A1 | 12/2020 | Ding et al. |
| 2021/0226154 A1 | 7/2021 | Ban et al. |
| 2021/0376293 A1 | 12/2021 | Zhao et al. |
| 2022/0013601 A1 | 1/2022 | Deng et al. |

FOREIGN PATENT DOCUMENTS

| | | |
|---|---|---|
| CN | 110649177 | 1/2020 |
| CN | 111293148 | 6/2020 |

* cited by examiner

LIGHT-EMITTING SUBSTRATE AND METHOD OF MANUFACTURING THE SAME, AND LIGHT-EMITTING APPARATUS

CROSS-REFERENCE TO RELATED APPLICATION

This application claims priority to Chinese Patent Application No. 202010906721.4, filed on Sep. 1, 2020, which is incorporated herein by reference in its entirety.

TECHNICAL FIELD

The present disclosure relates to the field of display technologies, and in particular, to a light-emitting substrate and a method of manufacturing the same, and a light-emitting apparatus.

BACKGROUND

With the popularization of electronic display products, the adaptability of electronic display products to the environment has attracted more and more attention from users.

SUMMARY

In one aspect, a light-emitting substrate is provided. The light-emitting substrate has a light-emitting region and an isolation region located outside the light-emitting region. The light-emitting substrate includes: a base, an isolation portion disposed on the base and located in the isolation region, and a second insulating pattern located in the light-emitting region. The isolation portion includes a first conductive pattern, a second conductive pattern and a first insulating pattern that are sequentially stacked on the base. An orthogonal projection of the first conductive pattern on the base is located within an orthogonal projection of the second conductive pattern on the base; and a side face of the first conductive pattern proximate to the light-emitting region and a corresponding side face of the second conductive pattern proximate to the light-emitting region have a first gap therebetween. The second insulating pattern and the first insulating pattern are arranged in a same layer; and a side face of the second insulating pattern proximate to the first insulating pattern and a side face of the first insulating pattern proximate to the second insulating pattern have a second gap therebetween.

In some embodiments, the light-emitting substrate further includes a first conductive layer located in the light-emitting region and the isolation region. The first conductive layer is located on a side of the second insulating pattern layer and the isolation portion away from the base, and the first conductive layer is disconnected on a side of the isolation portion proximate to the light-emitting region.

In some embodiments, the light-emitting substrate further includes a light-emitting functional layer being closer to the base than the first conductive layer. The light-emitting functional layer is located in the light-emitting region and the isolation region, and the light-emitting functional layer is disconnected on the side of the isolation portion proximate to the light-emitting region; or the light-emitting functional layer is located only in the light-emitting region, the light-emitting functional layer includes a plurality of light-emitting functional patterns that are spaced apart; and orthogonal projections of the plurality of light-emitting functional patterns on the base is located within an orthogonal projection of the second insulating pattern on the base.

In some embodiments, the light-emitting substrate further includes a pixel defining layer disposed between the second insulating pattern and the first conductive layer and located in the light-emitting region. The pixel defining layer includes a plurality of first openings, and a portion of the light-emitting functional layer is disposed in each opening.

In some embodiments, the pixel defining layer is made of lyophobic material.

In some embodiments, at least one groove is provided on a surface of the first insulating pattern layer away from the base, and an extending direction of the at least one groove is approximately the same as an extending direction of the isolation portion.

In some embodiments, in a direction perpendicular to the extending direction of the isolation portion, a width of each groove is in a range from 4 μm to 6 μm.

In some embodiments, the at least one groove includes at least two grooves, and the at least two grooves are sequentially arranged in a direction perpendicular to the extending direction of the isolation portion.

In some embodiments, the light-emitting substrate further has a frame region located outside the isolation region. The light-emitting substrate further includes: a plurality of pixel driving circuits disposed on the base and located in the light-emitting region and a gate driving circuit disposed on the base and located in the frame region. The gate driving circuit is coupled to the plurality of pixel driving circuits.

In some embodiments, the light-emitting substrate further includes a plurality of gate lines disposed on the base, and are coupled to the gate driving circuit and the plurality of pixel driving circuits. The isolation portion has a second opening, and the plurality of gate lines pass through the second opening of the isolation portion to be coupled to the gate driving circuit.

In another aspect, a light-emitting apparatus is provided. The light-emitting apparatus includes: the light-emitting substrate as described in any of the above embodiments and a driving circuit coupled to the light-emitting substrate. The driving circuit is configured to drive the light-emitting substrate to emit light.

In yet another aspect, a method of manufacturing a light-emitting substrate is provided. The method includes: sequentially forming a first conductive pattern and a second conductive pattern that are located in an isolation region on a base, an orthogonal projection of the first conductive pattern on the base being located within an orthogonal projection of the second conductive pattern on the base, and a side face of the first conductive pattern proximate to a light-emitting region and a corresponding side face of the second conductive pattern proximate to the light-emitting region having a first gap therebetween; the isolation region being located outside the light-emitting region; forming an insulating film on the base on which the first conductive pattern and the second conductive pattern have been formed; patterning the insulating film to form a second insulating pattern located in the light-emitting region, an etching barrier pattern located in first gap and an insulating pattern portion located on the second conductive pattern, the second insulating pattern and the etching barrier pattern having a third gap therebetween; and removing the etching barrier pattern and a portion of the insulating pattern portion to form a first insulating pattern located on the second conductive pattern, so as to form an isolation portion including the first conductive pattern, the second conductive pattern and the first insulating pattern, a side face of the second insulating pattern proximate to the first insulating pattern and a side face of the first insulating pattern proximate to the second insulating pattern having a second gap therebetween.

In some embodiments, a surface of the insulating pattern portion away from the base has at least one initial groove, and a surface of the first insulating pattern away from the base has at least one groove.

In some embodiments, the insulating film is made of photoresist; and removing the etching barrier pattern and the portion of the insulating pattern portion, includes: removing the etching barrier pattern and the portion of the insulating pattern portion through an ashing process.

In some embodiments, before removing the etching barrier pattern and the portion of the insulating pattern portion, the method further includes: forming a conductive film on the base on which the first conductive pattern, the second conductive pattern, the second insulating pattern, the insulating pattern portion, and the etching barrier pattern have been formed; and etching the conductive film by using an etching solution to form a plurality of electrodes.

In some embodiments, the method further includes: forming a photoresist film on the base on which the plurality of electrodes have been formed before removing the etching barrier pattern and the portion of the insulating pattern portion; patterning the photoresist film through an exposure process and a development process to form a photoresist retention pattern located in the light-emitting region; and removing a portion of the photoresist retention pattern to form a pixel defining layer including a plurality of first openings when the etching barrier pattern is removed through the ashing process. An orthogonal projection of each first opening on the base and an orthogonal projection of a corresponding electrode on the base are overlapped.

In some embodiments, before removing the etching barrier pattern and the portion of the insulating pattern portion, the method further includes developing a portion of the etching barrier pattern when the photoresist film is developed. A duration of developing the portion of the etching barrier pattern is greater than a duration of developing the photoresist film.

In some embodiments, the method further includes: forming a light-emitting functional layer located in the light-emitting region and the isolation region on the base on which the pixel defining layer has been formed, a portion of the light-emitting functional layer being located in each first opening, and the light-emitting functional layer being disconnected on a side of the isolation portion proximate to the light-emitting region; or forming a light-emitting functional layer located only in the light-emitting region on the base on which the pixel defining layer has been formed, the light-emitting functional layer including a plurality of light-emitting functional pattern that are spaced apart, each light-emitting functional pattern being located in one first opening, and orthogonal projections of the plurality of light-emitting functional patterns on the base being located within an orthogonal projection of the second insulating pattern on the base.

In some embodiments, the method further includes forming a first conductive layer on a side of the light-emitting functional layer away from the base located in the light-emitting region and the isolation region. The first conductive layer is disconnected on a side of the isolation portion proximate to the light-emitting region.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
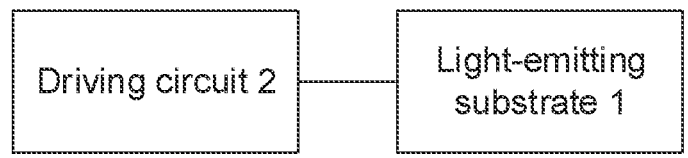
FIG. 1 is a schematic block diagram of a light-emitting apparatus, in accordance with some embodiments.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first", "second" are only used for descriptive purposes, and are not to be construed as indicating or implying the relative importance or implicitly indicating the number of indicated technical features, Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" may also mean that two or more components are not in direct contact with each other, but still cooperate or interact with each other. The embodiments disclosed herein are not necessarily limited to the content herein.

As used herein, depending on the context, the term "if" is optionally construed as "when" or "in a case where".

The use of the phase or "configured to" herein means an open and inclusive language, which does not exclude apparatuses that are applicable to or configured to perform additional tasks or steps.

As used herein, "approximately" includes a stated value and an average value within an acceptable deviation range of a specific value. The acceptable deviation range is determined by a person of ordinary skill in the art in view of the measurement in question and errors associated with a specific amount of measurement (i.e., the limitations of a measurement system).

Exemplary embodiments are described herein with reference to sectional views and/or plan views as idealized exemplary drawings. In the accompanying drawings, thicknesses of layers and regions are enlarged for clarity. Variations in shape with respect to the accompanying drawings due to, for example, manufacturing technologies and/or tolerances may be envisaged. Therefore, the exemplary embodiments should not be construed to be limited to shapes of areas shown herein, but to include deviations in shape due to, for example, manufacturing. For example, an etched area shown in a rectangular shape generally has a curved feature. Therefore, the areas shown in the accompanying drawings are schematic in nature, and their shapes are not intended to show actual shapes of the areas in a device, and are not intended to limit the scope of the exemplary embodiments.

During the production and use of electronic display products, moisture, oxygen and the like in the external environment will intrude into an interior of the electronic display products. For example, moisture, oxygen and the like may react with structures in the electronic display products to affect electrical properties thereof, thereby reducing properties and lifespans of the electronic display products.

Some embodiments of the present disclosure provide a light-emitting apparatus.

In some embodiments, the light-emitting apparatus may be a lighting apparatus, such as a lamp, or a display apparatus, such as a mobile phone, a tablet computer, a notebook, a personal digital assistant (FDA) or a vehicle-mounted computer.

In some embodiments, the light-emitting apparatus may be a passive driving apparatus, such as a passive matrix organic light-emitting diode (PMOLED): or the light-emitting apparatus may be an active driving device, such as an active matrix OLED (AMOLED).

As shown in FIG. 1, the light-emitting apparatus 3 includes a light-emitting substrate 1 and a driving circuit 2 coupled to the light-emitting substrate 1. The driving circuit 2 is configured to drive the light-emitting substrate 1 to emit light. For example, the driving circuit 2 may be a driving chip or a driving IC.

Figure 2:
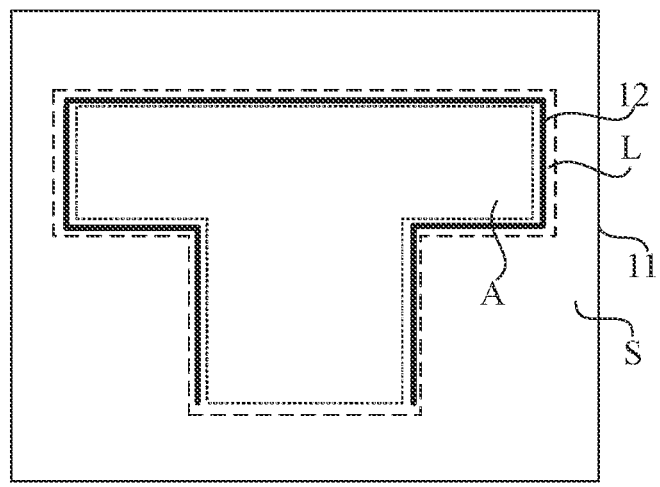
FIG. 2 is a schematic top view illustration of a light-emitting substrate, in accordance with some embodiments.

As shown in FIG. 2, the light-emitting substrate 1 provided in some embodiments of the present disclosure has a light-emitting region A and an isolation region L. The isolation region L is located outside the light-emitting region A. The light-emitting region A and the isolation region L are adjacent. For example, the isolation region L is located on at least one side of the light-emitting region A. For another example, the light-emitting region A and the isolation region L are connected to each other. That is, a border of the light-emitting region A coincides with a border of the isolation region L.

In some examples, the light-emitting region A serves as a display region.

As shown in FIG. 2, the light-emitting substrate 1 includes a base 11 and an isolation portion 12 disposed on the base 11 and located in the isolation region L.

Figure 3A:
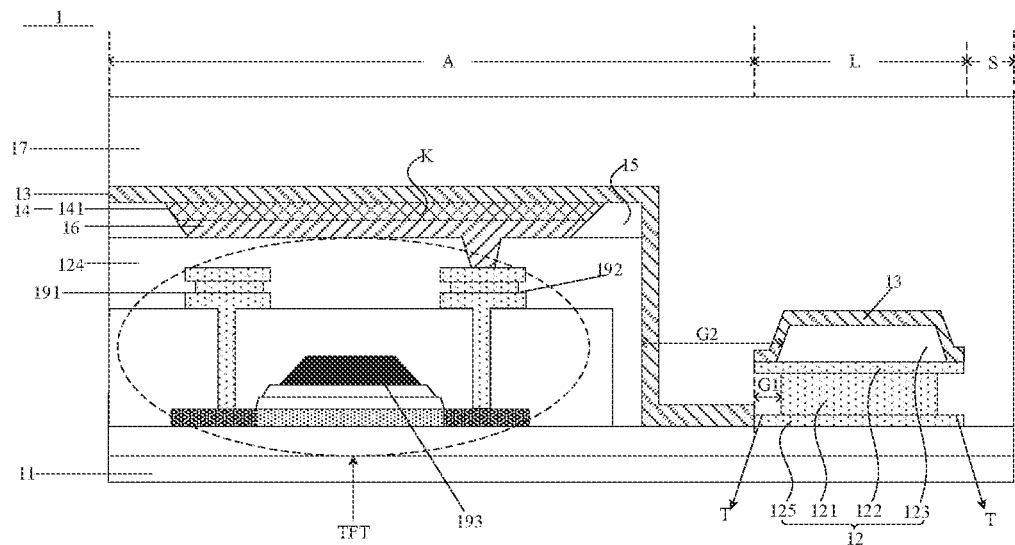
FIG. 3A is a partial sectional view illustration of a light-emitting substrate, in accordance with some embodiments.
Figure 3B:
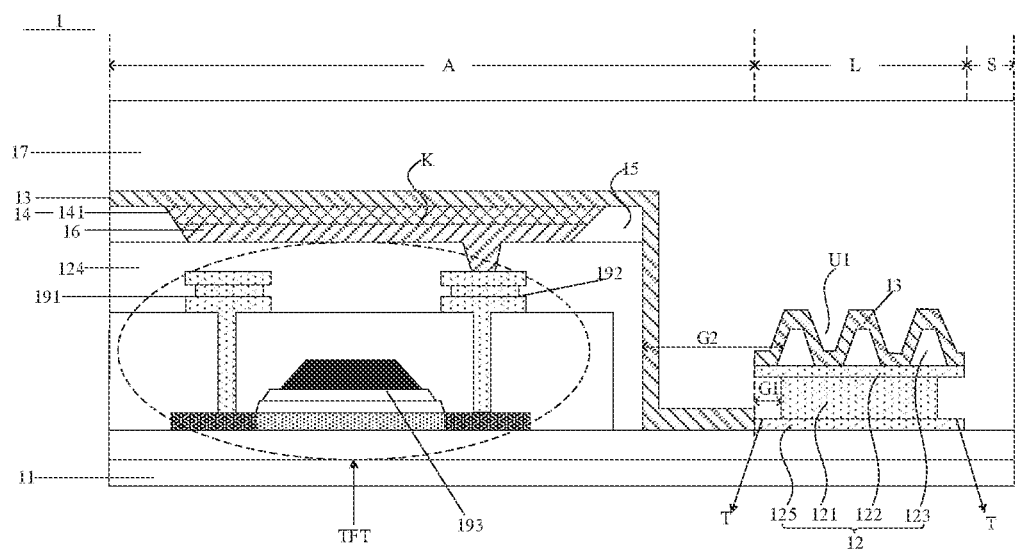
FIG. 3B is a partial sectional view illustration of another light-emitting substrate, in accordance with some embodiments.
Figure 4:
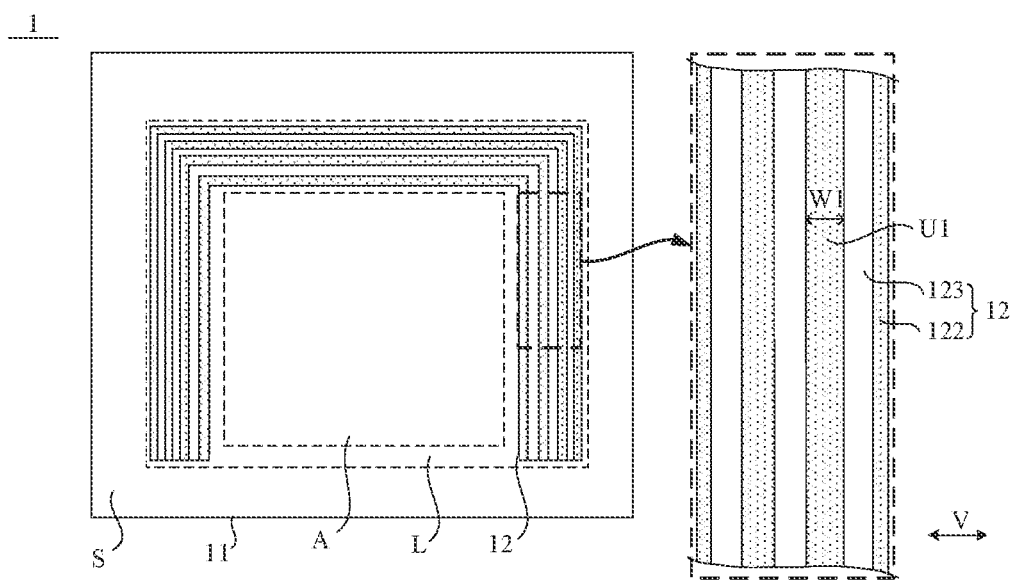
FIG. 4 is schematic top view illustration of another light-emitting substrate, in accordance with some embodiments.

As shown in FIGS. 3A, 3B and 4, the isolation portion 12 includes a first conductive pattern 121, a second conductive pattern 122 and a first insulating pattern 123 that are sequentially stacked on the base 11. That is, in a thickness direction of the base 11, the second conductive pattern 122 is located between the first conductive pattern 121 and the first insulating pattern 123, and the first conductive pattern 121 is closer to the base 11 than the first insulating pattern 123.

Referring to FIGS. 3A and 3B, an orthogonal projection of the first conductive pattern 121 on the base 11 is located within an orthogonal projection of the second conductive pattern 122 on the base 11. There is a first gap G1 between a side face, proximate to the light-emitting region A, of the first conductive pattern 121 and a corresponding side face, proximate to the light-emitting region A, of the second conductive pattern 122.

That is, the side face of the first conductive pattern 121 proximate to the light-emitting region A is indented inwardly relative to the corresponding side face of the second conductive pattern 122, so that a depression T is provided between the side face of the first conductive pattern 121 and the corresponding side face of the second conductive pattern 122.

Of course, there is another first gap G1 between another side face (e.g., opposite to the side face of the first conductive pattern 121 proximate to the light-emitting region A) of the first conductive pattern 121 and another corresponding side face of the second conductive pattern 122 proximate to the another side face of the first conductive pattern 121.

As shown in FIG. 2, the light-emitting substrate 1 further includes a second insulating pattern 124. The second insulating pattern 124 is disposed on the base 11, and is located in the light-emitting region A.

Referring to FIG. 2, the first insulating pattern 123 and the second insulating pattern 124 are arranged in the same layer. There is a second gap G2 between a side face, proximate to the second insulating pattern 124, of the first insulating pattern 123 and a side face, proximate to the side face of the first insulating pattern 123, of the second insulating pattern 124.

In some examples, the base 11 is a rigid substrate, such as a glass substrate. In some other examples, the base 11 is a flexible substrate, such as a polyimide (PI) substrate.

The light-emitting region A may be in an arbitrary shape. For examples, the light-emitting region A is in a regular rectangular. For another example, the light-emitting region A is in a special shape (i.e., non-rectangular), such as a circle or a hexagon, so as to meet an increasing demand for special-shaped light-emitting products. In this case, the light-emitting substrate 1 may be made into a light-emitting substrate having a light-emitting region A in an arbitrary shape (e.g., a circle, a rectangle or a hexagon).

The isolation portion 12 may extend along the border of the light-emitting region A. For example, the isolation portion 12 surrounds the light-emitting region A.

Figure 5:
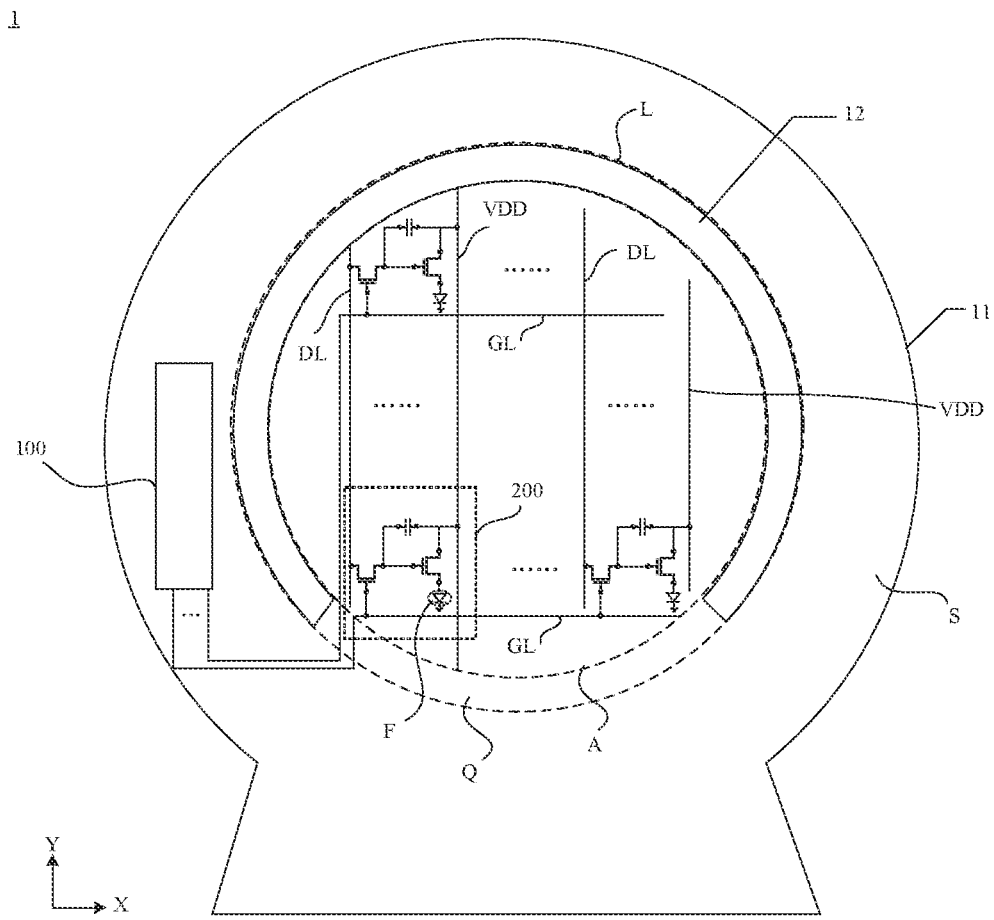
FIG. 5 is a schematic diagram of a light-emitting substrate, in accordance with some embodiments.

For example, as shown in FIG. 5, the shape of the light-emitting region A is circular or approximately circular, and at least one edge of the orthogonal projection of the isolation portion 12 on the base 11 is in an arc shape. In this case, the light-emitting apparatus 3 using the light-emitting substrate 1 may be a wristwatch. That is, the light-emitting substrate 1 may be made into a display substrate of a wristwatch.

For example, the light-emitting substrate 1 is a display substrate.

In some embodiments, the second insulating pattern 124 serves as a planarization layer. For example, the planarization layer may be made of an organic insulating material, such as resin.

The first insulating pattern 123 and the second insulating pattern 124 are disposed in the same layer, so that the first insulating pattern 123 and the second insulating pattern 124 may be formed simultaneously. For example, the first insulating pattern 123 and the second insulating pattern 124 are formed by a single patterning process, that is, they are formed by patterning the same film. In addition, that there is the second gap G2 between the side face of the first insulating pattern 123 proximate to the second insulating pattern 124 and the side face of the second insulating pattern 124 proximate to the side face of the first insulating pattern 123 means that, in a process of patterning the same film to form the first insulating pattern 123 and the second insulating pattern 124, a portion of the film located in a region between a region where the first insulating pattern 123 is to be formed and a region where the second insulating pattern 124 is to be formed may be completely removed, so that first insulating pattern 123 and second insulating pattern 124 are spaced apart.

In the light-emitting substrate 1 provided in the embodiments of the present disclosure, since the first insulating pattern 123 is spaced apart from the second insulating pattern 124, and the isolation portion 12 is of a stacked structure including the first conductive pattern 121, the second conductive pattern 122 and the first insulating pattern 123, there is a large height difference between the isolation portion 12 and a portion in the region between the region where the isolation portion 12 is located and the region where the second insulating pattern 124 is located. Therefore, it is equivalent to increasing an overall thickness of the isolation portion 12, and an intrusion path of external moisture and oxygen may be extended.

In some embodiments, as shown in FIG. 2, the light-emitting substrate 1 further includes a first conductive layer 13 located in the light-emitting region A and the isolation region L. The first conductive layer 13 is located on a side of the second insulating pattern 124 and the isolation portion 12 away from the base 11, and the first conductive layer 13 is disconnected on a side of the isolation portion 12 proximate to the light-emitting region A. For example, the first conductive layer 13 is disconnected at a position of a side face of the isolation portion 12 proximate to the light-emitting region A. In this case, a portion of the first conductive layer 13 in the light-emitting region A and a portion of the first conductive layer 13 in the isolation region L are not connected.

In some embodiments, the first conductive layer 13 is a conductive layer including anodes or cathodes of a plurality of light-emitting devices.

For example, the first conductive layer 13 is the conductive layer including the cathodes of the plurality of light-emitting devices, and the first conductive layer 13 is transparent or semitransparent. In this case, if the anodes of the plurality of light-emitting devices are disposed at a side of the cathodes proximate to the base 11, and the anodes of the plurality of light-emitting devices are non-transparent, the light-emitting substrate 1 is a top-emission light-emitting substrate.

For example, the first conductive layer 13 is the conductive layer including cathodes of the plurality of light-emitting devices, and the first conductive layer 13 is non-transparent. In this case, if the anodes of the plurality of light-emitting devices are disposed at a side of the cathodes proximate to the base 11, and the anodes of the plurality of light-emitting devices are transparent, the light-emitting substrate is a bottom-emission light-emitting substrate.

In a case where the first conductive layer 13 is the conductive layer including cathodes of the plurality of light-emitting devices, a material of the first conductive layer 13 may be selected from metal materials with a low work function. For example, the first conductive layer 13 is made of a material with high conductivity and a low work function such as magnesium (Mg), aluminum (Al), lithium (Li), silver (Ag), or and other simple metals. Or the first conductive layer 13 is made of alloys of corrosion-resistant metals (e.g., magnesium-silver alloys, lithium aluminum alloys, etc.). For the top-emission light-emitting substrate, the first conductive layer 13 has a small thickness, and for the bottom-emission light-emitting substrate, the first conductive layer 13 has a large thickness.

On this basis, a material of the anodes (i.e., electrodes 16) of the plurality of light-emitting devices may include a conductive material with a high work function. For the bottom-emission light-emitting substrate, the material of the anodes of the plurality of light-emitting devices may be selected from transparent conductive materials with a high work function. For example, the anode is made of a transparent conductive material with a high work function, such as indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, or the like. For the top-emission light-emitting substrate, the anode is a stacked structure composed of at least one layer made of the transparent conductive material with a high work function and metallic layer(s).

In this case, in a process of forming the first conductive layer 13, since the overall thickness of the isolation portion 12 is large, it is difficult for the first conductive layer 13 to climb up on the side of the isolation portion 12 proximate to the light-emitting region A, and the first conductive layer 13 is disconnected at the position of the side face of the isolation portion 12 proximate to the light-emitting region A. Moreover, since the side face of the first conductive pattern 121 proximate to the light-emitting region A is indented inwardly relative to the corresponding side face of the second conductive pattern 122, it is more conducive to disconnection of the first conductive layer 13 at the position of the side face of the isolation portion 12 proximate to the light-emitting region A. Based on this, it is possible to block the path of external moisture and oxygen entering the light-emitting region A along the first conductive layer 13, so as to prevent moisture and oxygen from entering the light-emitting region A along the first conductive layer 13 to affect the stability of each light-emitting device in the light-emitting region A. Therefore, a yield of the light-emitting substrate 1 may be increased.

In some embodiments, as shown in FIGS. 3A, 3B, 6 and 7, the light-emitting substrate 1 further includes a light-emitting functional layer 14 at least located in the light-emitting region A. The light-emitting functional layer 14 is closer to the base 11 than the first conductive layer 13.

Figure 6:
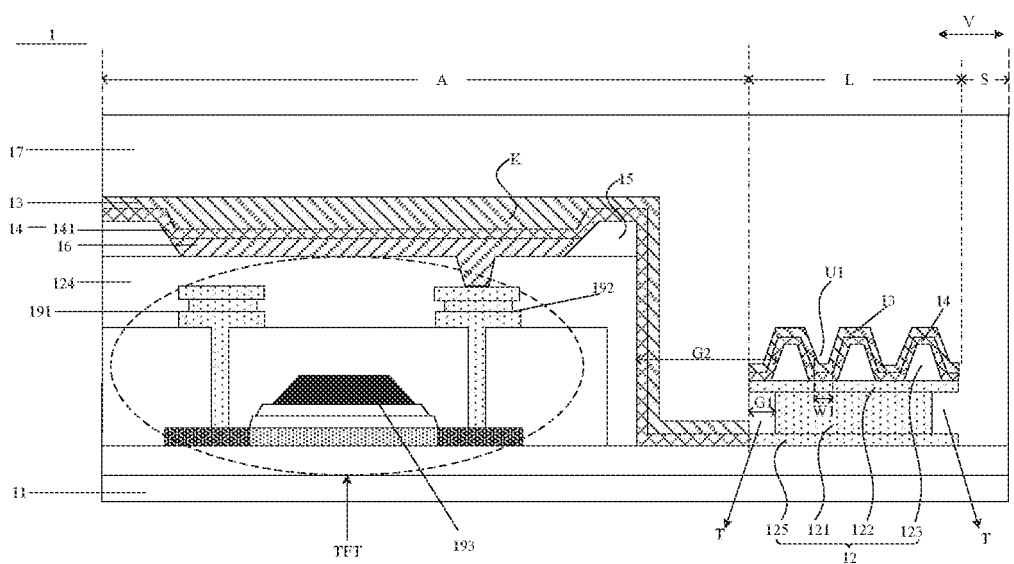
FIG. 6 is a partial sectional view of yet another light-emitting substrate, in accordance with some embodiments.
Figure 7:
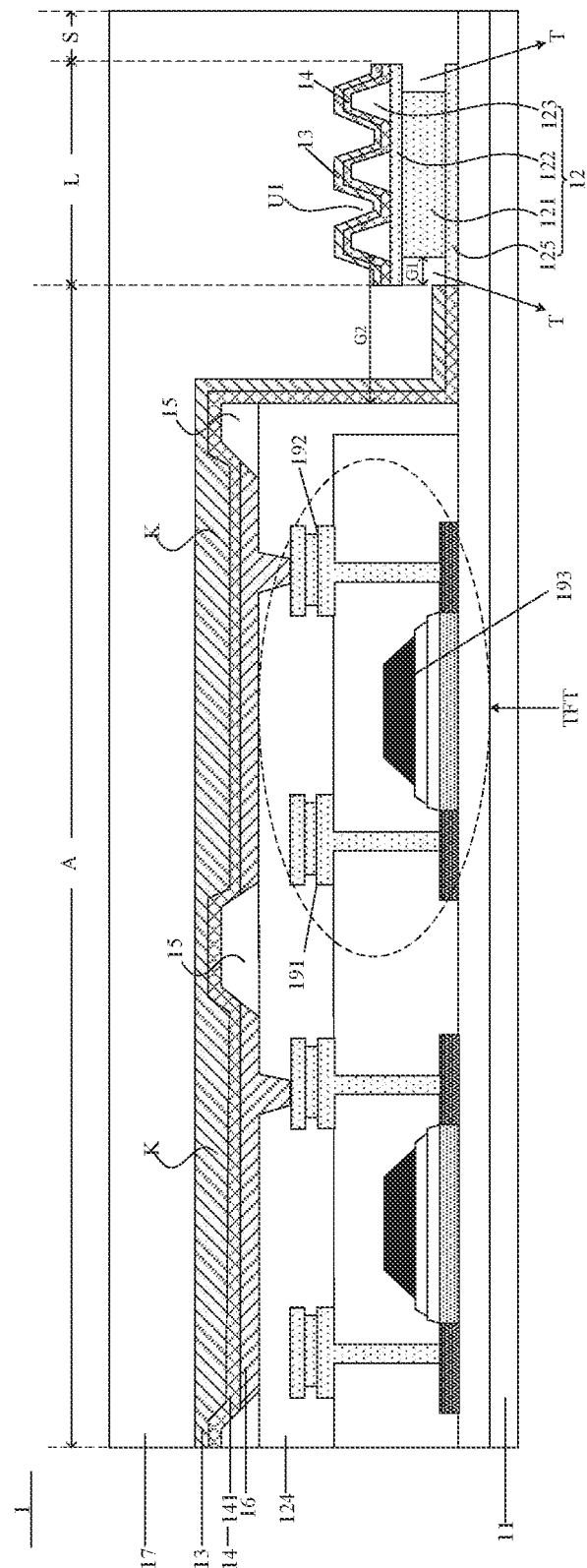
FIG. 7 is a partial sectional view of yet another light-emitting substrate, in accordance with some embodiments.

In some examples, as shown in FIGS. 6 and 7, the light-emitting functional layer 14 is located in the light-emitting region A and the isolation region L, and the light-emitting functional layer 14 is disconnected on the side of the isolation portion 12 proximate to the light-emitting region A. That is, a portion of the light-emitting functional layer 14 in the light-emitting region A is of a one-piece structure.

The light-emitting functional layer 14 is disconnected on the side of the isolation portion 12 proximate to the light-emitting region A, so that the portion of the light-emitting functional layer 14 in the light-emitting region A and a portion of the light-emitting functional layer 14 in the isolation region L are not connected. Therefore, it is possible to block the path of external moisture and oxygen entering the light-emitting region A from the isolation region L through the light-emitting functional layer 14. That is, it is possible to prevent external moisture and oxygen from entering the light-emitting region A from the isolation region L through the light-emitting functional layer 14, thereby further improving the moisture and oxygen isolation effect, and preventing damage to light-emitting device including a portion of the light-emitting functional layer 14 (referred as a light-emitting functional pattern 141).

For example, the light-emitting functional layer 14 may be formed through an evaporation process. During the evaporation process, the light-emitting functional layer 14 is disconnected on the side of the isolation portion 12 proximate to the light-emitting region A due to a partitioning effect of the isolation portion 12, so that the light-emitting substrate 1 having the customized light-emitting region A may be formed without depending on a fine metal mask. In this way, it is possible to form the light-emitting substrate 1 having the customized light-emitting region A and save the manufacturing cost of a mask adapted to the shape of the light-emitting region A.

In some other examples, as shown in FIGS. 3A and 3B, the light-emitting functional layer 14 is located only in the light-emitting region A, and the light-emitting functional layer 14 includes a plurality of light-emitting functional patterns 141 that are spaced apart. An orthogonal projection of the plurality of light-emitting functional patterns 141 on the base 11 is located within the orthogonal projection of the second insulating pattern 124 on the base 11.

For example, the light-emitting functional patterns 141 are manufactured through an inkjet printing process. In a process of manufacturing the light-emitting functional patterns 141 through the inkjet printing process, ink including a material for forming the light-emitting functional patterns 141 is printed in first openings included in a pixel defining layer. In this way, by precisely controlling process conditions, the light-emitting functional layer 14 can be formed only in the light-emitting region A and each light-emitting functional pattern can be formed in a respective one of the first openings included in the pixel defining layer. In this case, as long as the first conductive layer 13 is disconnected on the side of the isolation portion 12 proximate to the light-emitting region A, moisture and oxygen may be prevented from entering the light-emitting region A from the isolation region L.

In some embodiments, as shown in FIGS. 3A, 3B, 6 and 7, the light-emitting substrate 1 further includes the pixel defining layer 15 disposed between the second insulating pattern 124 and the first conductive layer 13, and located in the light-emitting region A. The pixel defining layer 15 includes the first openings K, and a portion of the light-emitting functional layer 14 is disposed in each first opening K. That is, as shown in FIGS. 3A and 3B, each light-emitting functional pattern 141 is provided in a corresponding opening K; or as shown in FIGS. 6 and 7, a portion of the light-emitting functional layer 14 is disposed in each opening K, and the portion of the light-emitting functional layer 14 located in each first opening K may serve as the light-emitting function pattern 141 of the light-emitting device.

For the light-emitting functional layer 14 located in the light-emitting region A and the isolation region L, referring to FIGS. 6 and 7, the light-emitting functional layer 14 not only includes the portions located in the first openings K, but also includes a portion located on a portion of the pixel defining layer 15 other than the first openings K. Therefore, the light-emitting functional layer 14 is a continuous layer in the light-emitting region A.

For the light-emitting functional layer 14 located only in the light-emitting region A, referring to FIGS. 3A and 3B, according to the control accuracy of the inkjet position of the inkjet printing process, each light-emitting functional pattern 141 may be completely formed in the corresponding opening K, or each light-emitting functional pattern is not only formed in the corresponding first opening K, but also formed on the pixel defining layer 15.

In some embodiments, the pixel defining layer 15 may be made of a lyophobic material. Since the pixel defining layer 15 has good lyophobic performance, ink does not spread to climb or remain on a sidewall of the first opening K, and ink overflow may be prevented. As a result, the light-emitting functional pattern 141 may be well formed in the first opening K.

In some embodiments, as shown in FIGS. 3B, 4, 6 and 7, at least one groove U1 is provided on a surface of the first insulating pattern 123 away from the base 11. A depth direction of the at least one groove U1 is parallel to the thickness direction of the base 11. That is, at least a portion of the surface of the first insulating pattern 123 away from the base 11 is depressed toward the base 11 in the thickness direction of the base 11 to obtain at least one groove U1.

Each groove U1 extends along an extending direction of an edge of the orthogonal projection of the first conductive pattern 121 on the base 11 proximate to the light-emitting region A. For example, an extending direction of each groove U1 is the same or approximately the same as an extending direction R of the isolation portion 12.

In this case, by providing the at least one groove U1 on the surface of the first conductive pattern 121 away from the base 11, an overlap area between the first conductive layer 13 and the isolation portion 12 may be increased, thereby enhancing a bonding strength of the isolation portion 12 and the first conductive layer 13. Moreover, a path of intrusion of external moisture and oxygen may be extended, so that external moisture and oxygen may be prevented from entering the light-emitting substrate 1, and the yield of the light-emitting substrate 1 may be increased.

In addition, in a process of manufacturing the light-emitting functional layer 14 and the first conductive layer 13 by using the evaporation process, climbing difficulty of the material of the first conductive layer 13 and the material of the light-emitting functional layer 14 may be increased. For example, for the first conductive layer 13 as the conductive layer including the plurality of cathodes, in a case where there is at least one groove U1, and a longitudinal section (i.e., a section in the thickness direction of the base 11) of the first groove U1 is in a trapezoid or triangle, since a thickness of the cathode is relatively small, the thickness of the cathode is smaller at sharp corner position(s) of the first insulating pattern 123, and moisture at the position where the thickness of the cathode is small is reduced, thereby preventing entry of external moisture and oxygen and improving the performance of the light-emitting substrate 1.

A depth of the first groove U1 may be equal to a thickness of the first insulating pattern 123. That is, the first groove U1 is a via hole. Or, the depth of the first groove U1 may be less than the thickness of the first insulating pattern 123.

For example, referring to FIGS. 4 and 6, in a direction V perpendicular to an extending direction of the isolation portion 12, a width W1 of each groove U1 is in a range from 4 µm to 6 µm, such as 4 µm, 4.5 µm, 5 µm, 5.5 µm, or 6 µm. The width W1 of each groove U1 is gradually increased in a direction away from the base 11 along the thickness direction of the base 11. For example, a width of an orthogonal projection of each groove U1 on the base 11 may be in a range from 4 µm to 6 µm. In this case, an intrusion path of external moisture and oxygen may be extended, and the external moisture and oxygen may be absorbed by a portion of the first conductive layer 13 located in the isolation region L during the intrusion process, thereby reducing the entry of external moisture and oxygen.

It will be noted that, the direction perpendicular to the extending direction of the isolation portion 12 is a direction, on any side of the light-emitting region A, perpendicular to the extending direction of the isolation portion 12.

In some embodiments, referring to FIGS. 3B, 4, 6 and 7, the at least one groove U1 includes at least two grooves U1, and the at least two grooves U1 are sequentially arranged in the direction perpendicular to the extending direction of the isolation portion 12. In this case, the at least two grooves U1 may extend the intrusion path of external moisture and oxygen, so as to block the path of external moisture and oxygen entering the light-emitting region A.

It will be noted that the embodiments of the present disclosure do not limit a planar shape of the isolation portion 12 (i.e., a shape of the orthogonal projection of the isolation portion 12 on the base 11). In some examples, the planar shape of the isolation portion 12 may be a closed ring surrounding the light-emitting region A, and may be set to, for example, a rectangular ring, a circular ring, a nearly circular ring and an ellipse according to the shape of the light-emitting region A, so that the isolation portion 12 may have an isolation effect in any planar direction. In some other examples, referring to FIG. 5, the planar shape of the isolation portion 12 may be a shape having a second opening (i.e., a notch) Q, that is, the orthogonal projection of the isolation portion 12 on the base 11 is not closed. The second opening Q may be provided in a region that isolation is not necessary, which may prevent the material of the isolation portion 12 from being swelled due to thermal expansion, and maintain a good isolation effect. In addition, the planar shape of the isolation portion 12 may be linear or a curved. For example, an edge or a corner of a rectangle may be slightly curved as long as a good isolation effect may be achieved, which is not limited in the embodiments of the present disclosure.

In some embodiments, referring to FIG. 5, the light-emitting substrate 1 may further include a plurality of pixel driving circuits 200. The plurality of pixel driving circuits 200 are disposed on the base 11 and located in the light-emitting region A. Each pixel driving circuit 200 is coupled to one light-emitting device F. The pixel driving circuit 200 is configured to drive the light-emitting device F to emit light.

It will be noted that, a specific structure of the pixel circuit may be designed according to actual conditions, which is not limited in the embodiments of the present disclosure. For example, the pixel circuit is composed of electronic elements such as transistors (e.g., thin film transistors (TFTs)) and capacitor(s). For example, the pixel circuit includes two transistors and one capacitor to form a 2T1C structure. For another example, the pixel circuit includes more than two transistors and at least one capacitor, e.g., seven transistors and one capacitor to form a 7T1C structure.

For example, the plurality of pixel driving circuits 200 are arranged in an array. Referring to FIG. 5, the pixel driving circuits 200 arranged in a line in a first direction X may be regarded as the same row of pixel driving circuits 200; and the pixel driving circuits 200 arranged in a line in a second direction Y may be regarded as the same column of pixel driving circuits 200. The first direction X crosses the second direction Y. For example, the first direction X is perpendicular to the second direction Y.

In some embodiments, referring to FIGS. 2 and 4, the light-emitting substrate 1 further has a frame region S. The frame region S may be located outside the isolation region L. That is, the frame region S is also located outside the light-emitting region A. For example, the frame region S is located outside the isolation region L, and surrounds the light-emitting region A.

Referring to FIG. 5, the light-emitting substrate 1 may further include a gate driving circuit 100 disposed on the base 11 and located in the frame region S. The gate driving circuit 100 is coupled to the plurality of pixel driving circuits 200. The gate driving circuit 100 is configured to provide gate scan signals to the plurality of pixel driving circuits 200, so as to control the plurality of pixel driving circuits that have received the gate scan signals to operate.

In some embodiments, referring to FIG. 5, the light-emitting substrate 1 further includes a plurality of gate lines GL disposed on the base 11. Each gate line GL is coupled to pixel driving circuits 200. For example, the gate line GL is coupled to the same row of pixel driving circuits 200. Each gate line GL is further coupled to the gate driving circuit 100. The gate line GL is configured to transmit a gate scan signal provided by the gate driving circuit 100 to the pixel driving circuits 200 coupled to the gate line GL.

In addition, referring to FIG. 5, the light-emitting substrate 1 may further include a plurality of data lines DL disposed on the base 11. The plurality of pixel driving circuits 200 are coupled to the plurality of data lines DL. Each data line DL is coupled to pixel driving circuits 200. For example, the data line DL is coupled to the same column of pixel driving circuits 200. The data line DL is configured to transmit a data signal to the pixel driving circuits 200 coupled to the data line DL.

For example, as shown in FIG. 5, the isolation portion 12 has the second opening Q, and the plurality of gate lines GL pass through the second opening Q to be coupled to the gate driving circuit 100. That is, the gate driving circuit 100 is coupled to the plurality of pixel driving circuits 200 in the light-emitting region A through the plurality of gate lines GL passing through the second opening Q of the isolation portion 12, so as to provide gate scanning signals to the plurality of pixel driving circuits 200 through the plurality of gate lines GL.

In addition, referring to FIG. 5, the pixel driving circuit 200 is further coupled to a power supply voltage line VDD for transmitting a power supply voltage (e.g., a direct current high voltage). Each pixel driving circuit 200 outputs a driving signal according to the data signal and the power supply voltage, and drive the light-emitting device F coupled to the pixel driving circuit 200 to emit light.

In some embodiments, referring to FIG. 6, the isolation portion 12 further includes a third conductive pattern 125. The third conductive pattern 125 is located on a side of the first conductive pattern 121 proximate to the base 11. An edge of an orthogonal projection of the third conductive pattern 125 on the base 11 is beyond the edge of the orthogonal projection of the first conductive pattern 121 on the base 11. That is, the side faces of the first conductive pattern 121 are indented inwardly relative to side faces of the third conductive pattern 125 in the direction from the light-emitting region A to the isolation region L. For example, the edge of the orthogonal projection of the third conductive pattern 125 on the base 11 coincides with or approximately coincides with the edge of the orthogonal projection of the second conductive pattern 122 on the base 11. In the thickness direction of the base 11, a sectional shape of the first conductive pattern 121 and the second conductive pattern 122 and the third conductive pattern 125 that are located on both sides of the first conductive pattern 121 may be the "I" shape. In this case, it is more conducive for the first conductive layer 13 to be disconnected at the side of the isolation portion 12 proximate to the light-emitting region A.

Some embodiments of the present disclosure provide a method of manufacturing a light-emitting substrate. For example, the light-emitting substrate may be the light-emitting substrate 1 in any of the above embodiments. For example, referring to FIG. 2, the light-emitting substrate 1 has a light-emitting region A and an isolation region L located outside the light-emitting region A. The light-emitting region A and the isolation region L are adjacent. For example, the light-emitting region A and the isolation region L are connected, that is, a border of the light-emitting region A coincides with a border of the isolation region L.

Figure 8:
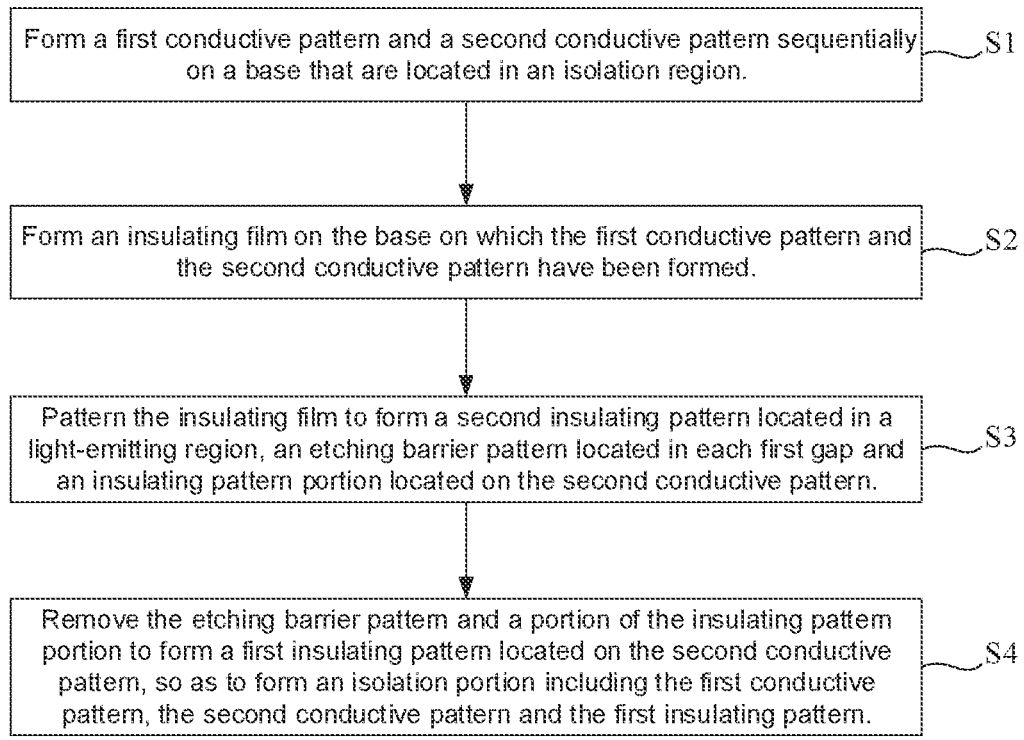
FIG. 8 is a flow diagram of manufacturing a light-emitting substrate, in accordance with some embodiments.

As shown in FIG. 8, the method includes S1 to S4.

In S1, a first conductive pattern and a second conductive pattern are sequentially formed on a base and located in the isolation region.

Figure 9A:
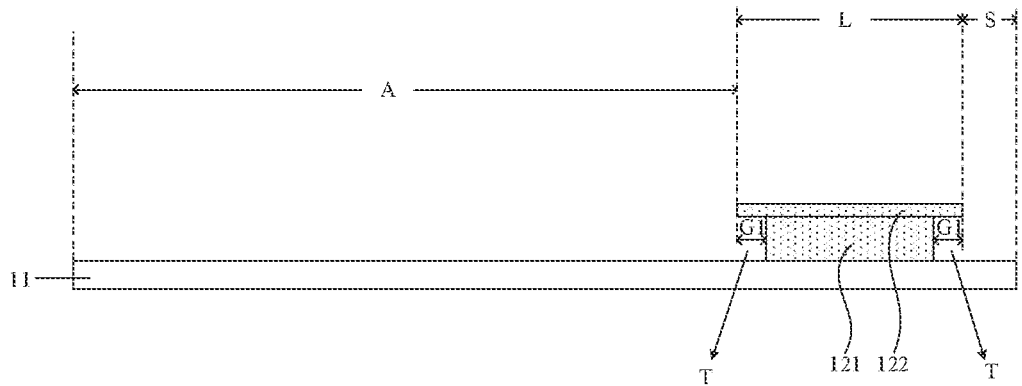
FIGS. 9A to 9D are schematic diagrams illustrating a process of manufacturing a light-emitting substrate, in accordance with some embodiments.

As shown in FIG. 9A, the first conductive pattern 121 and the second conductive pattern 122 that are located in the isolation area L are sequentially formed on a base 11. An orthogonal projection of the first conductive pattern 121 on the base 11 is located within an orthogonal projection of the second conductive pattern 122 on the base 11. There is a first gap G1 between a side face, proximate to the light-emitting region A, of the first conductive pattern 121 and a corresponding side face, proximate to the light-emitting region A, of the second conductive pattern 122, That is, the side face, proximate to the light-emitting region A, of the first conductive pattern 121 is indented inwardly relative to the corresponding side face of the second conductive pattern 122, so that a depression T is provided between the side face of the first conductive pattern 121 and the corresponding side face of the second conductive pattern 122. Of course, there is another first gap G1 between another side face (e.g., opposite to the side face of the first conductive pattern 121 proximate to the light-emitting region A) of the first conductive pattern 121 and another corresponding side face of the second conductive pattern 122 proximate to the another side face of the first conductive pattern 121.

The first conductive pattern 121 and the second conductive pattern 122 may be formed independently. For example, the first conductive pattern 121 is formed by; forming a first conductive film used for forming the first conductive pattern 121; coating a photoresist on the first conductive film; and exposing, developing, and etching the first conductive film. Then the second conductive pattern 122 is formed by: forming a second conductive film used for the second conductive pattern 122 on the base 11 on which the first conductive pattern 121 has been formed; coating a photoresist on the second conductive film; and exposing, developing, and etching the second conductive film.

The first conductive pattern 121 and the second conductive pattern 122 may also be formed simultaneously. For example, a material of the first conductive pattern 121 is metallic aluminum, and a material of the second conductive pattern 122 is metallic titanium. In this case, a first conductive film and a second conductive film are formed first, and then an etching solution of metallic aluminum (e.g., a mixed acid containing $HNO_3$, $H_3PO_4$ and acetic acid (AcH)) is used for etching to form the first conductive pattern 121 and the second conductive pattern 122 are formed. After forming the first conductive pattern 121 and the second conductive pattern 122, each side face of the first conductive pattern 121 may be indented inwardly relative to the corresponding side face of the second conductive pattern 122 due to different etching rates. It will be understood that, each side face of the first conductive pattern 121 and the corresponding side face of the second conductive pattern 122 serves as a portion of a side face of an isolation portion 12 formed subsequently.

In S2, an insulating film is formed on the base on which the first conductive pattern and the second conductive pattern have been formed.

Figure 9B:
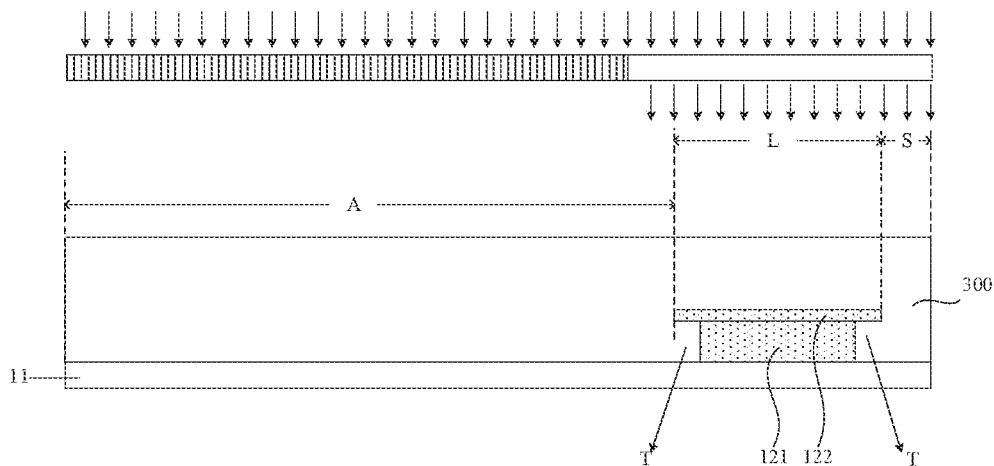

As shown in FIG. 9B, the insulating film 300 is formed on the base 11 on which the first conductive pattern 121 and the second conductive pattern 122 have been formed.

In S3, the insulating film is patterned to form a second insulating pattern located in the light-emitting region, an etching barrier pattern located in each first gap, and an insulating pattern portion located on the second conductive pattern.

Figure 9C:
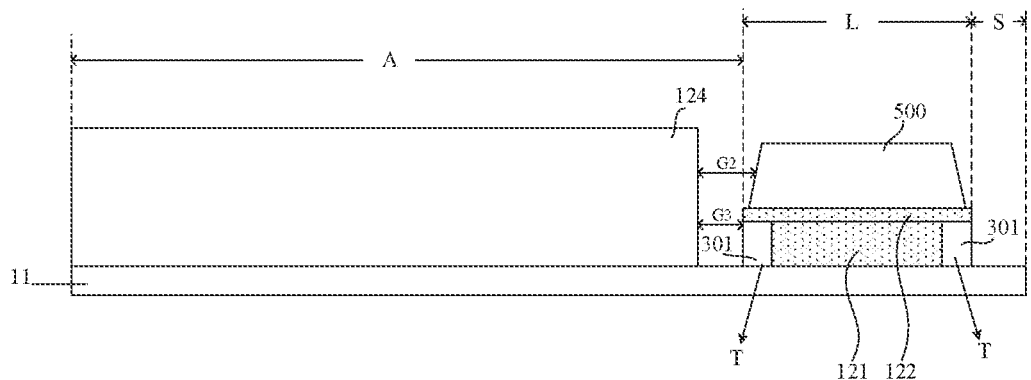

As shown in FIGS. 9B and 9C, by patterning the insulating film 300, the second insulating pattern 124 located in the light-emitting region A, the etching barrier pattern 301 located in the first gap G1 (i.e., the depression T), and the insulating pattern portion 500 located on the second conductive pattern 122 are formed. There is a second gap G2 between a side face of the insulating pattern portion 500 proximate to the second insulating pattern 124 and a side face of the second insulating pattern 124 proximate to the side face of the insulating pattern portion 500. There is a third gap G3 between a side face of the second insulating pattern 124 proximate to the isolation region L and a side face of the etching barrier pattern 301 at a side of the first conductive pattern 121 proximate to the light-emitting region A.

For example, the insulating film 300 is made of photoresist. In this case, photoresist is coated on the base 11 on which the first conductive pattern 121 and the second conductive pattern 122 have been formed to form a photoresist film serving as the insulating film 300.

The photoresist film is located in the light-emitting region A and the isolation region L, and is filled in the first gap G1 in the isolation region L. In a process of patterning the photoresist film, through an exposure process and a development process, a portion of the photoresist film is removed to form the second insulating pattern 124 located in the light-emitting region A, the etching barrier pattern 301 in the first gap G1, and the insulating pattern portion 500 located on the second conductive pattern 122; and then a post-baking process is performed on the second insulating pattern 124, the etching barrier pattern 301 and the second conductive pattern 122.

For example, a material of the photoresist film (i.e., the insulating film 300) is a positive photoresist. By exposing and developing a portion of the photoresist film in a region other than regions where the second insulating pattern 124 and the insulating pattern portion 500 are to be formed, the second insulating pattern 124 located in the light-emitting region A and the insulating pattern portion 500 located on the second conductive pattern 122 are formed. Meanwhile, since the second conductive pattern 122 has a shielding effect, a portion of the photoresist film (i.e., a portion of the insulating film 300) at the first gap G1 is not exposed, and the etching barrier pattern 301 is formed after the development process.

In S4, the etching barrier pattern and a portion of the insulating pattern portion are removed to form a first insulating pattern located on the second conductive pattern, so as to form an isolation portion including the first conductive pattern, the second conductive pattern and the first insulating pattern.

Figure 9D:
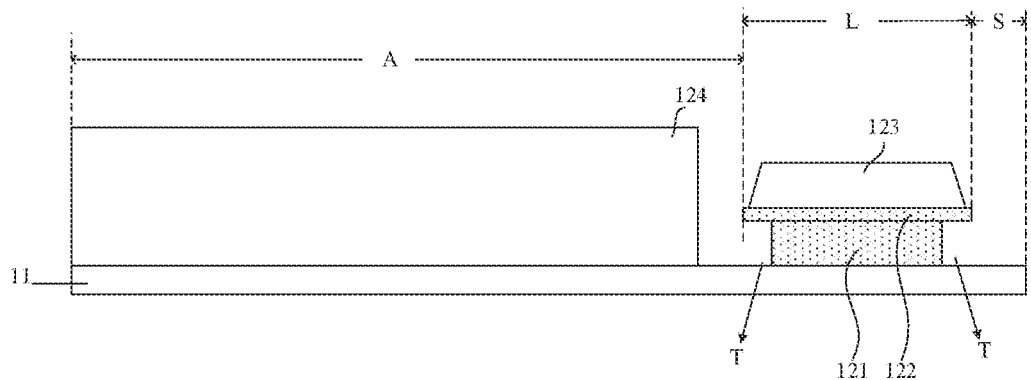

For example, referring to FIGS. 9C and 9D, the material of the etching barrier pattern 301 is photoresist, and the etching barrier pattern 301 is removed through an ashing process. In this way, the "T"-shaped structure composed of the first conductive pattern 121 and the second conductive pattern 122 in the isolation portion 12 may be restored only by adding the ashing process without adding a mask process, thereby saving the production process and cost.

It will be noted that in the above embodiments, the etching barrier pattern 301 may be removed after a subsequent process.

In a process of removing the etching barrier pattern 301, the insulating pattern portion 500 is thinned to form the first insulating pattern 123. In addition, the second insulating pattern 124 may also be thinned.

The ashing process refers to a process in which carbon (C), hydrogen (H), oxygen (O), nitrogen (N) and other elements in the photoresist (i.e., the photoresist film) react with oxygen plasma to generate gas to be volatilized, so that the photoresist is continuously thinned until the etching barrier pattern 301 is removed.

For example, portions of the photoresist film that needs to be retained may be obtained through exposure and development processes. In this process, a thickness of the retained portions may be controlled to obtain the insulating pattern portion 500 and the second insulating pattern 124 with a certain thickness. Subsequently, when the etching barrier pattern 301 is removed through the ashing process, a thickness of the insulating pattern portion 500 is reduced to obtain the first insulating pattern 123, so as to obtain the isolation portion 12 including the first conductive pattern 121, the second conductive pattern 122 and the first insulating pattern 123. Since the isolation portion 12 is of a three-layer structure, an overall thickness of the isolation portion 12 may be increased, thereby improving the isolation effect.

In some embodiments, the insulation pattern portion 500 and the second insulation pattern 124 may be formed by using a halftone mask to perform exposure and development processes, so as to ensure that the first insulation pattern 123 has a relatively large thickness. For example, by using the halftone mask, degrees of exposure of a portion of the photoresist film in a region where the insulating pattern portion 500 is to be formed and a portion of the photoresist film in the region where the second insulating pattern 124 is to be formed are different. In this way, the thickness of the insulating pattern portion 500 formed is different from a thickness of the second insulating pattern 124 formed. For example, the thickness of the insulating pattern portion 500 is greater than the thickness of the second insulating pattern 124, so that the first insulating pattern 123 may be ensured to have a large thickness when the portion of the insulating pattern portion 500 is removed through the ashing process.

For example, the thickness of the first insulating pattern 123 is in a range from $1/3$ to $2/3$ of the thickness of the second insulating pattern 124.

Figure 10A:
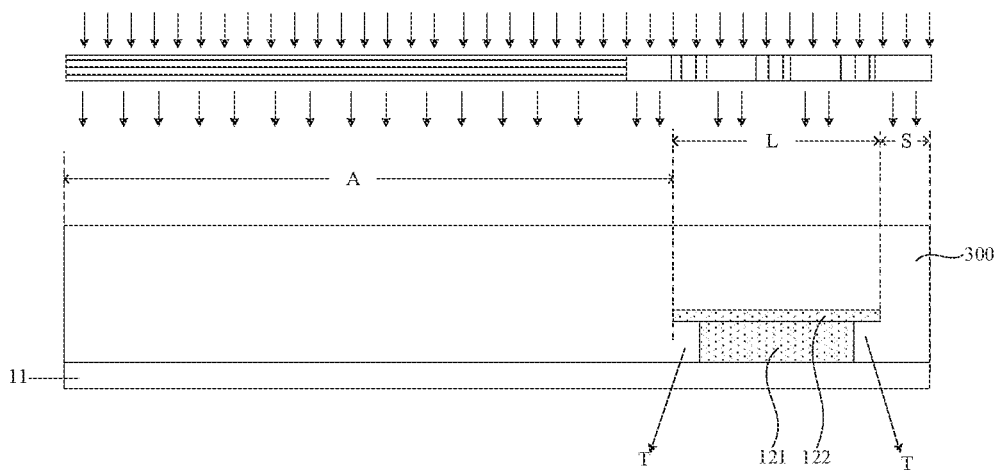
FIGS. 10A to 10E are schematic diagrams illustrating another process of manufacturing a light-emitting substrate, in accordance with some embodiments.
Figure 10B:
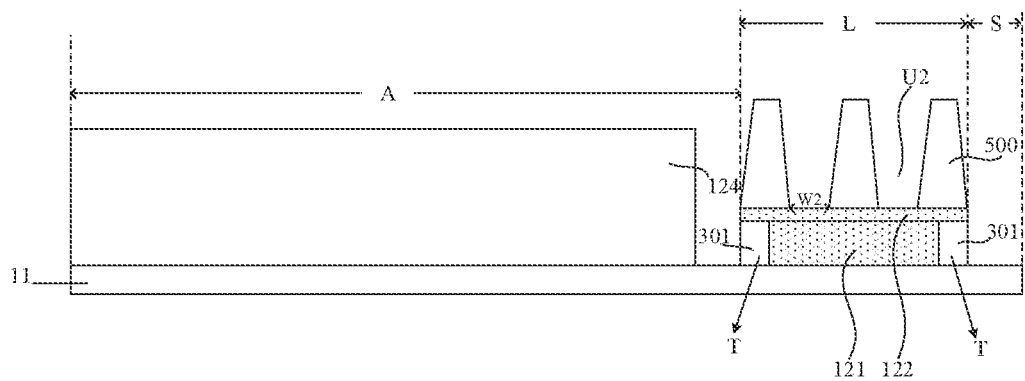
Figure 10C:
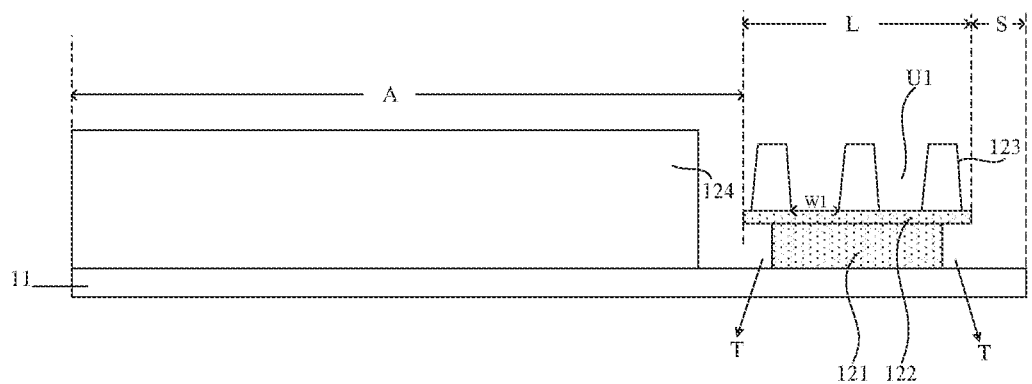
Figure 10D:
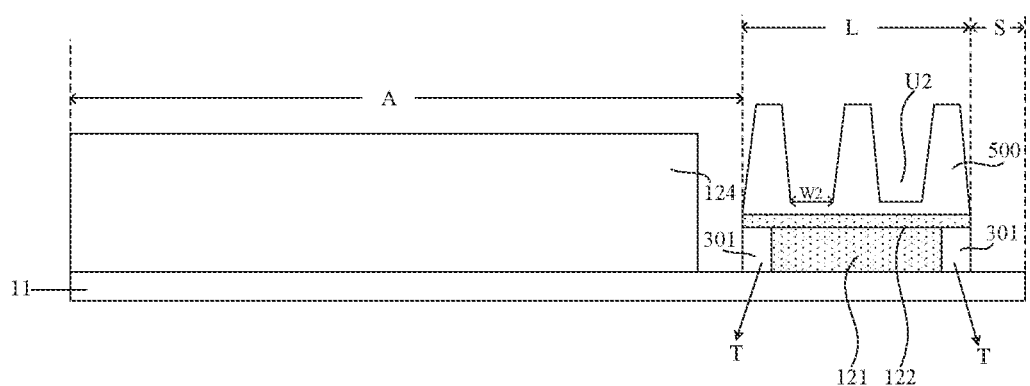
Figure 10E:
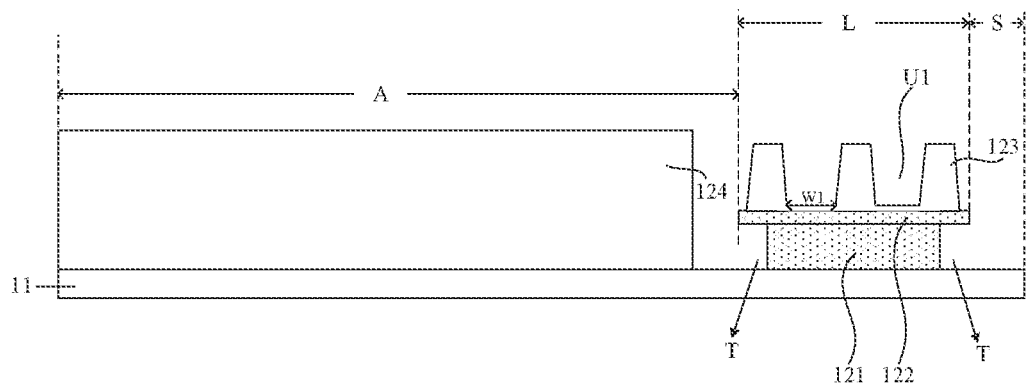

In some examples, as shown in FIGS. 10A, 10B and 10D, the insulating film 300 is patterned to form the second insulating pattern 124 located in the light-emitting region A, the etching barrier pattern 301 located in each first gap G1 and the insulating pattern portion 500 located on the second conductive pattern 122, and the insulating pattern portion 500 has at least one initial groove U2. The at least one initial groove U2 is disposed on a surface of the insulating pattern portion 500 away from the base 11; and as shown in FIGS. 10C and 10E, when the etching barrier pattern 301 is removed, the insulating pattern portion 500 is thinned to form the first insulating pattern 123 having at least one groove U1.

For example, referring to FIG. 10DC, the at least one initial groove U2 does not extend through the insulating pattern portion 500 in the thickness direction of the base 11. That is, a depth of the at least one initial groove U2 is less than the thickness of the insulating pattern portion 500. That is, the at least one initial groove U2 does not expose the second conductive pattern 122. In this case, referring to FIG. 10E, the obtained at least one groove U1 may not extend through the first insulating pattern 123 in the thickness direction of the base 11, that is, a depth of the at least one groove U1 is less than a thickness of the first insulating pattern 123. Or, the obtained at least one groove U1 may extend through the first insulating pattern 123 in the thickness direction of the base 11, that is, the depth of the at least one groove U1 is equal to a thickness of the first insulating pattern 123.

For example, Referring to FIG. 10B, the at least one initial groove U2 extends through the insulating pattern portion 500 in the thickness direction of the base 11. That is, the depth of the at least one initial groove U2 is equal to the thickness of the insulating pattern portion 500. That is, the at least one initial groove U2 exposes the second conductive pattern 122. In this case, referring to FIG. 10C, the obtained at least one groove U1 also extends through the first insulating pattern 123 in the thickness direction of the base 11. That is, the depth of the at least one groove U1 is equal to the thickness of the first insulating pattern 123.

In the process of removing the etching barrier pattern 301 through the ashing process, the ashing process may be performed in an isotropic plasma etching equipment. During the ashing process, as the thickness of the insulating pattern portion 500 is continuously decreased, a width of the insulating pattern portion 500 may be gradually decreased. In this way, in a process of ashing the at least one initial groove U2 into the at least one groove U1, a width W2 of each initial groove U2 is gradually increased in a direction perpendicular to an extending direction of the first conductive pattern 121 and the second conductive pattern 122. Therefore, a width W1 of each groove U1 formed is greater than the width W2 of each initial groove U2.

In some examples, in the direction perpendicular to the extending direction of the first conductive pattern 121 and the second conductive pattern 122, the width (or bottom dimension) W2 of the initial groove U2 is in a range from 2 μm to 3 μm. For example, the width W1 of the groove U1 is 1.5 to 3 times of the width W2 of the initial groove U2. In this case, the intrusion path of external moisture and oxygen may be extended, thereby improving the effect of isolating external moisture and oxygen.

In some embodiments, a conductive film is formed on the base on which the first conductive pattern, the second conductive pattern, the second insulating pattern, the insulating pattern portion, and the etching barrier pattern have been formed: and then the conductive film is etched by using an etching solution to form a plurality of electrodes.

Figure 11A:
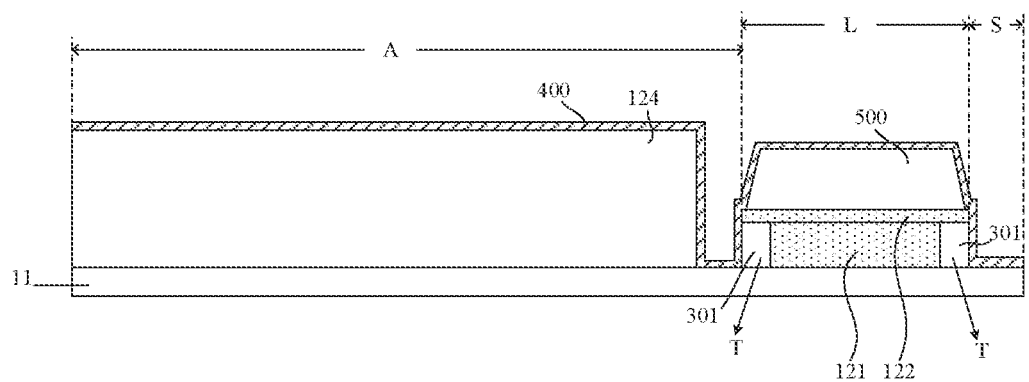
FIGS. 11A and 11B are schematic diagrams illustrating yet another process of manufacturing a light-emitting substrate, in accordance with some embodiments.

For example, as shown in FIG. 11A, a conductive film 400 is formed on the base on which the first conductive pattern 121, the second conductive pattern 122, the second insulating pattern 124, the insulating pattern portion 500, and the etching barrier pattern 301 have been formed. Then, referring to FIGS. 11A and 11B, the conductive film 400 is etched by using an etching solution to form the plurality of electrodes 16 located in the light-emitting region A.

Figure 11B:
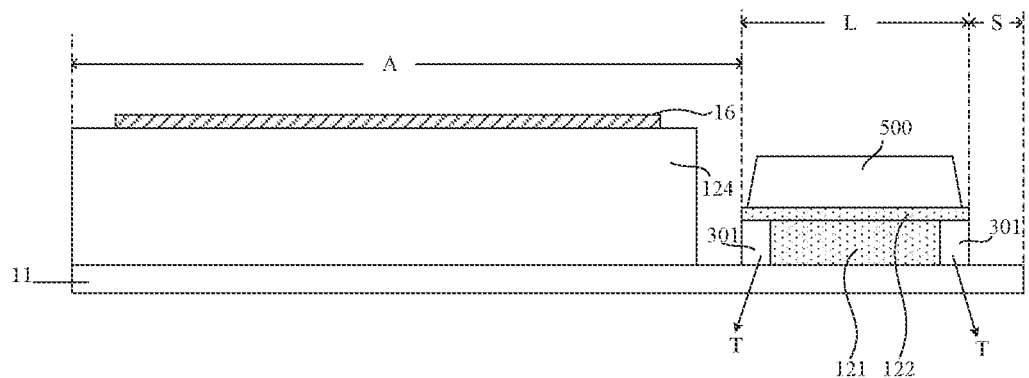

It will be noted that, FIGS. 11A and 11B illustrate a manufacturing process of an electrode 16. However, the other electrodes 16 of the plurality of electrodes 16 in the light-emitting substrate 1 may also be formed synchronously with the one electrode 16 by using the same process. That is, one or more electrodes 16 in the light-emitting substrate 1 shown in FIG. 7 may be obtained through the manufacturing process shown in FIGS. 11A and 11B.

For example, each of the plurality of electrodes 16 serves an anode, and the first conductive layer 13 formed subsequently includes cathodes of the light-emitting devices F. For the material of the plurality of electrodes 16, reference may be made to the above description relating to the anode material, which will not be repeated herein. In addition, each of the plurality of electrodes 16 may also serve the cathode, and the first conductive layer 13 formed subsequently includes anodes of the light-emitting devices F.

For example, the electrode 16 serves as the anode, and the conductive film 400 may be of a stacked structure composed of an ITO film, an Al film and an another ITO film. In a case where the material of the first conductive pattern 121 is metallic aluminum, and the conductive film 400 is etched by using the etching solution of metallic aluminum (e.g., the mixed acid containing $HNO_3$, $H_3PO_4$ and AcH), since the etching barrier pattern 301 is formed at the first gap G1 (i.e., depression T), it is possible to prevent the first conductive pattern 121 from being etched away when the conductive film 400 is etched. In this way, the second conductive pattern 122 may be prevented from collapsing, thereby facilitating the formation of the isolation portion 12.

Therefore, in a case where the etching solution for etching conductive film 400 is capable of reacting with the material of the first conductive pattern 121, by forming the etching barrier pattern 301 at the first gap G1 before forming the plurality of electrodes 16, it is possible to prevent the first conductive pattern 121 from being etched during etching the conductive film 400 to form the plurality of electrodes 16.

It will be noted that, after the etching barrier pattern 301 is formed by patterning the insulating film 300, and the plurality of electrodes 16 are formed, the etching barrier pattern 301 may be directly removed through the ashing process, or may be removed in a subsequent process.

Figure 12A:
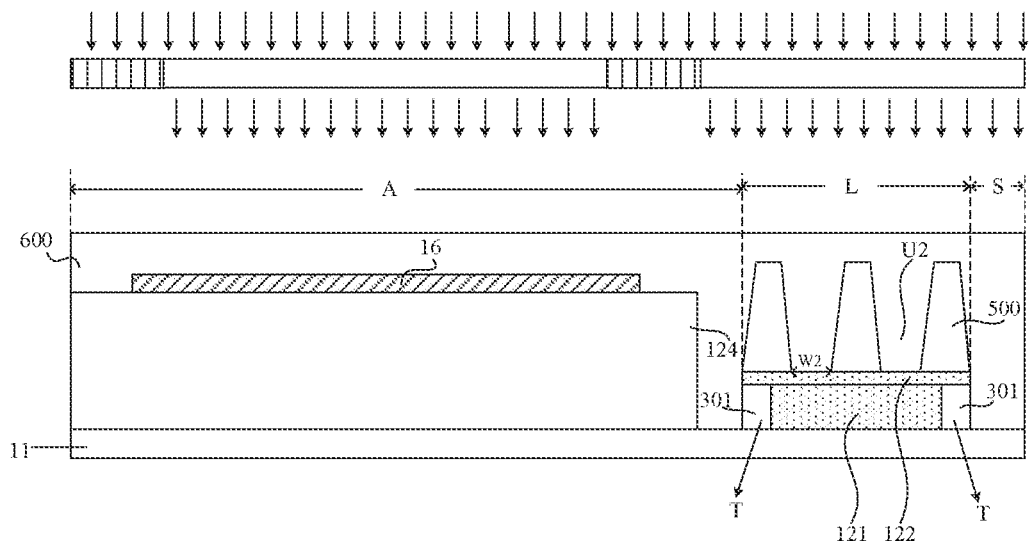
FIGS. 12A and 12E are schematic diagrams illustrating yet another process of manufacturing a light-emitting substrate, in accordance with some embodiments.
Figure 12B:
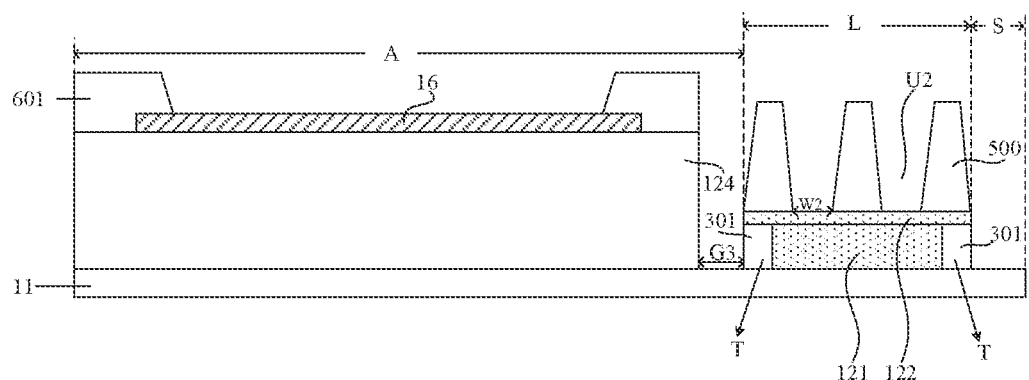
Figure 12C:
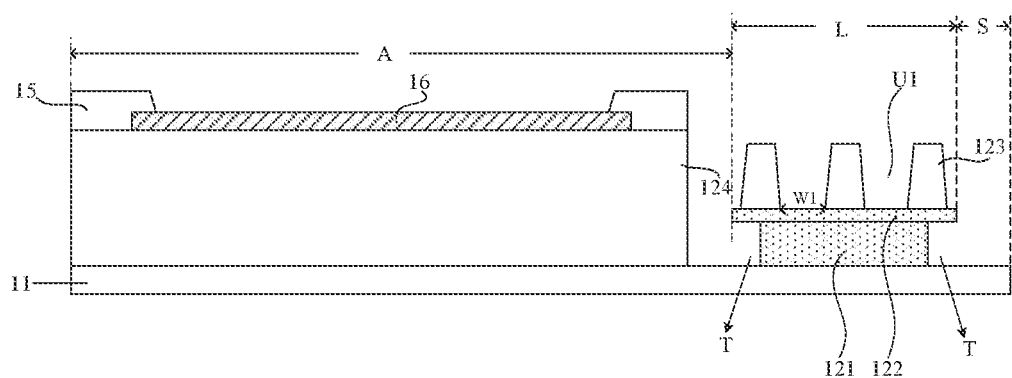
Figure 12D:
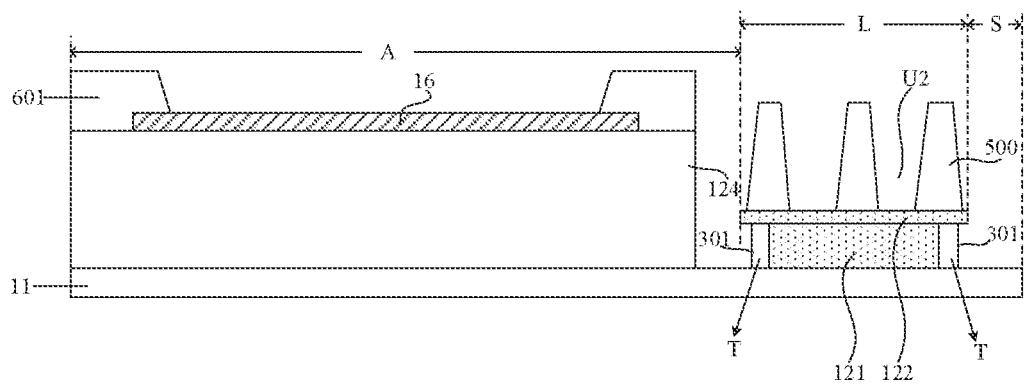
Figure 12E:
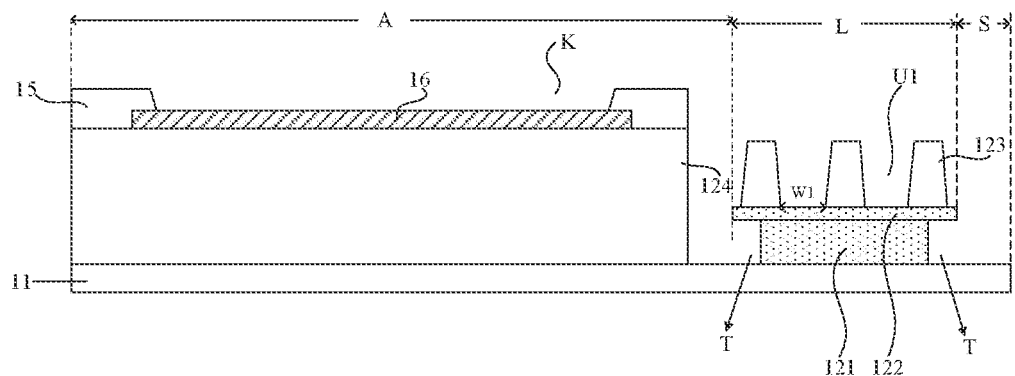

In some embodiments, as shown in FIGS. 12A, 12B and 12C, before removing the etching barrier pattern 301 through the ashing process, the method further includes: forming a photoresist film 600 on the base 11 on which the plurality of electrodes 16 and the etching barrier pattern 301 have been formed: and patterning the photoresist film 600 through the exposure process and the development process to form a photoresist retention pattern 601 located in the light-emitting region A. On this basis, when the etching barrier pattern 301 is removed through the ashing process, a portion of the photoresist retention pattern 601 is removed to form a pixel defining layer 15 including a plurality of first openings K.

Referring to FIG. 7, the pixel defining layer 15 includes the plurality of first openings K, and an orthogonal projection of each first opening K on the base 11 and an orthogonal projection of a corresponding electrode 16 on the base 11 are overlapped. That is, each first opening K exposes a portion of one electrode 16.

It will be understood that, since the plurality of electrodes 16 and the pixel defining layer 15 cover the second insulating pattern 124, when the etching barrier pattern 301 is removed through the ashing process, the thickness of the second insulating pattern 124 is not thinned.

Since the pixel defining layer 15 is formed when the etching barrier pattern 301 is removed through the ashing process, a manufacturing process may be simplified.

In some examples, as shown in FIGS. 12A, 12B, 12D and 12E, a portion of the etching barrier pattern 301 is developed when the photoresist film 600 is developed to form the photoresist retention pattern 601. A duration of developing the portion of the etching barrier pattern 301 is greater than a duration of developing the photoresist fi 600.

In this case, by controlling the development duration, the portion of the etching barrier pattern 301 may be developed. In this way, the aching duration may be reduced, and the etching barrier pattern 301 is ensured to be completely removed, thereby avoiding residual of the etching barrier pattern 301.

Figure 13:
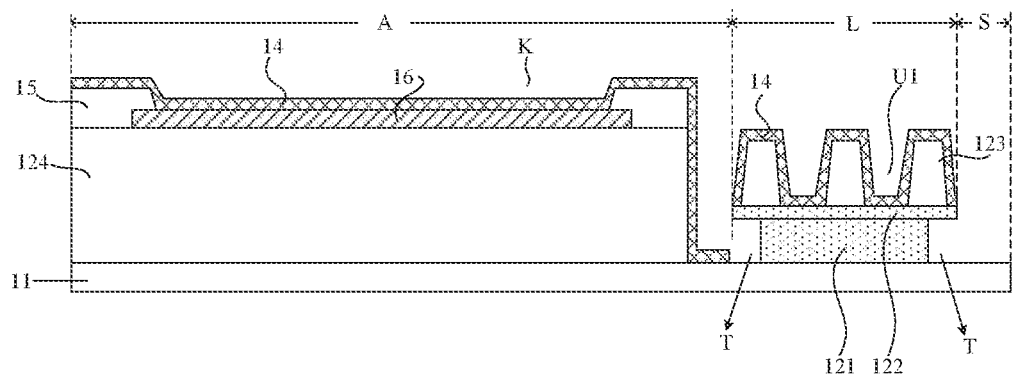
FIG. 13 is a schematic diagram illustrating yet another process of manufacturing a light-emitting substrate, in accordance with some embodiments.

In some embodiments, as shown in FIG. 13, the method further includes forming a light-emitting functional layer 14 on the base 11 on which the pixel defining layer 15 has been formed, and the light-emitting functional layer 14 is located in the light-emitting region A and the isolation region L. A portion of the light-emitting functional layer 14 is located in each first opening K. Here, the portion of the light-emitting functional layer 14 located in each first opening K is referred as a light-emitting functional pattern 141, and light-emitting functional patterns 141 located in the plurality of the first openings K are connected integrally to form the light-emitting functional layer 14. The light-emitting functional layer 14 is disconnected on a side of the isolation portion 12 proximate to the light-emitting region A.

Figure 14:
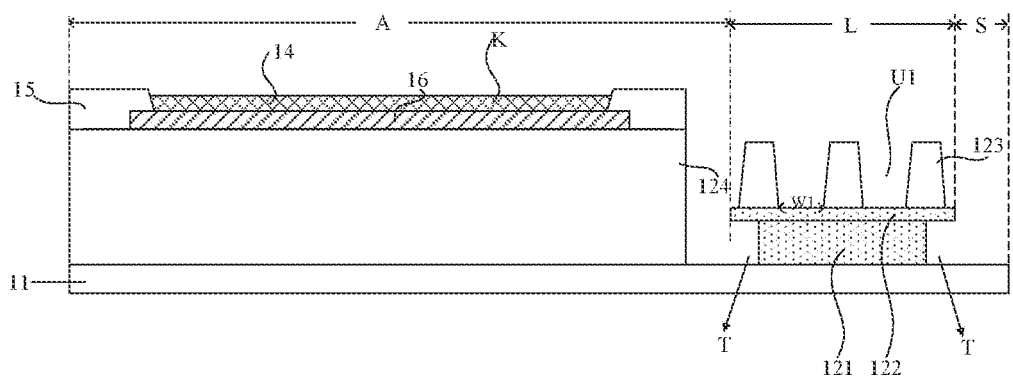
FIG. 14 is a schematic diagram illustrating yet another process of manufacturing a light-emitting substrate, in accordance with some embodiments.

In some other embodiments, as shown in FIG. 14, a light-emitting functional layer 14 is formed on the base 11 on which the pixel defining layer 15 has been formed and located only in the light-emitting region A. The light-emitting functional layer 14 includes a plurality of light-emitting functional pattern 141 that are spaced apart with each other. Each light-emitting functional pattern 141 is located in one first opening K. Orthogonal projections of the light-emitting functional patterns 141 on the base 11 are located within an orthogonal projection of the second insulating pattern 124 on the base 11.

In some examples, the light-emitting functional layer 14 may be formed on the base 11 by evaporation or inkjet printing.

Referring to FIG. 13, in a case where the light-emitting functional layer 14 is located in the light-emitting region A and the isolation region L, due to the existence of the isolation portion 12, the light-emitting functional layer 14 may be disconnected on the side of the isolation portion 12 proximate to the light-emitting region A, thereby isolating external moisture and oxygen, and preventing external moisture and oxygen from entering the light-emitting functional pattern 141.

Referring to FIG. 14, in a case where the light-emitting functional layer 14 is located only in the light-emitting region A, by controlling the inkjet printing process, the orthogonal projections of the plurality of light-emitting functional pattern 141 on the base 11 is located within the orthogonal projection of the second insulating pattern 124 on the base 11.

Figure 15:
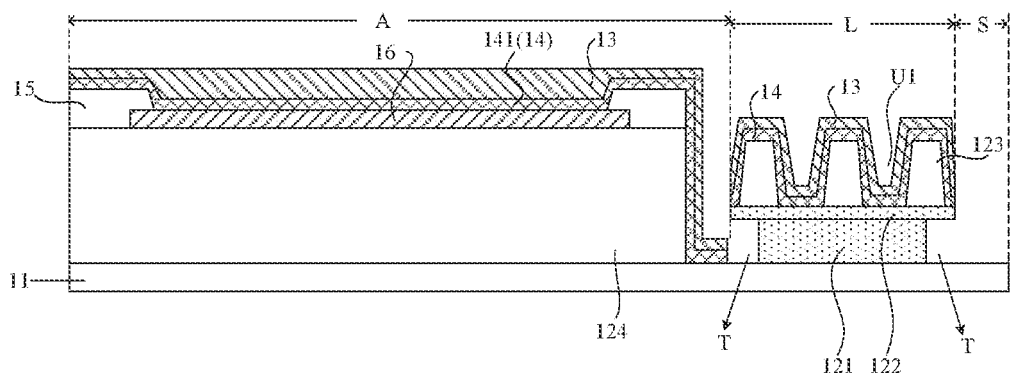
FIG. 15 is a schematic diagram illustrating yet another process of manufacturing a light-emitting substrate, in accordance with some embodiments.
Figure 16:
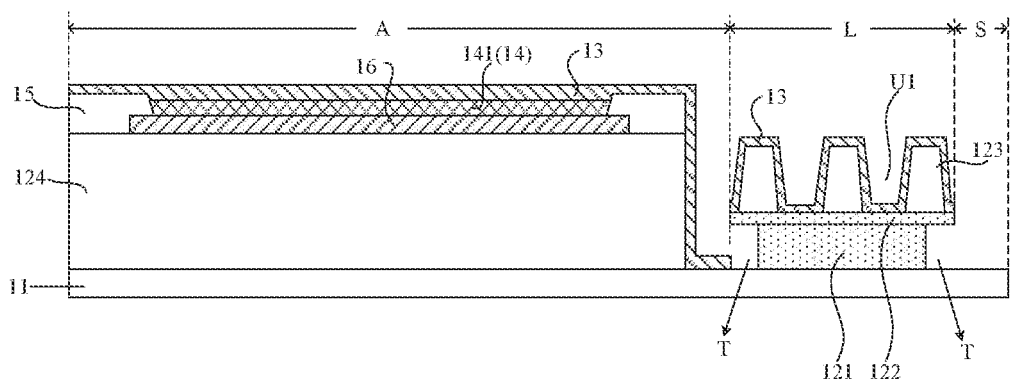
FIG. 16 is a schematic diagram illustrating yet another process of manufacturing a light-emitting substrate, in accordance with some embodiments.

In some embodiments, as shown in FIGS. 15 and 16, the method further includes forming the first conductive layer 13 on a side of the light-emitting functional layer 14 away from the base 11. That is, the first conductive layer 13 is formed on the base 11 on which the light-emitting functional layer 14 has been formed.

The first conductive layer 13 is located in the light-emitting region A and the isolation region L. The first conductive layer 13 is disconnected on the side of the isolation portion 12 proximate to the light-emitting region A.

In some examples, the first conductive layer 13 may be formed through an evaporation process.

Due to the existence of the isolation portion 12, the first conductive layer 13 may be disconnected on the side of the isolation portion 12 proximate to the light-emitting region A. In this way, the external moisture and oxygen may be isolated to prevent the external moisture and oxygen from entering the light-emitting functional pattern 141 through the first conductive layer 13.

Figure 17:
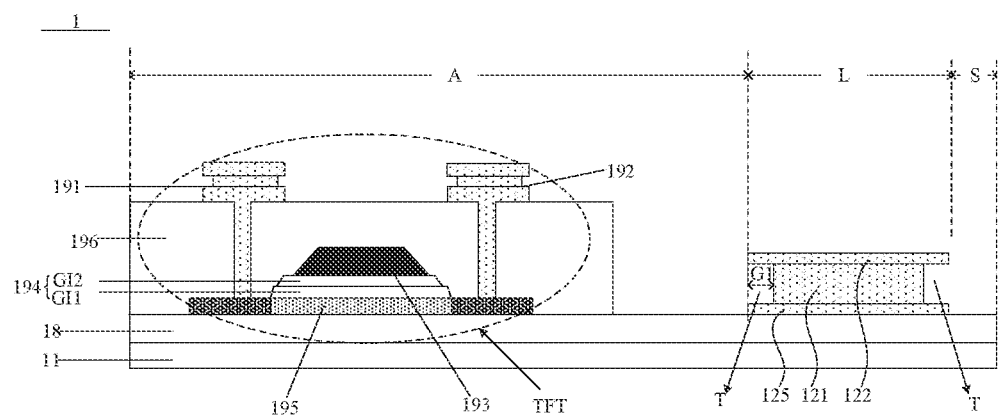
FIG. 17 is a schematic diagram illustrating yet another process of manufacturing a light-emitting substrate, in accordance with some embodiments.

In some embodiments, as shown in FIG. 17, the method further includes forming a third conductive pattern 125 on the base 11 and in the isolation region L.

The third conductive pattern 125 is located on a side of the first conductive pattern 121 proximate to the base 11. A material of the third conductive pattern 125 is the same as the material of the second conductive pattern 122.

For example, the material of the second conductive pattern 122 is metallic titanium, the material of the third conductive pattern 125 is also metallic titanium. In this case, in a manufacturing process, a metal titanium film, a metal aluminum film and an another metal titanium film may be sequentially formed on the base 11; then, a photoresist is coated on the uppermost metal titanium film, and a portion of the photoresist is removed by exposure and development; afterwards, and the metal titanium film, the metal aluminum film and the another metal titanium film that are stacked are etched by using an etching solution for etching metal aluminum to form the third conductive pattern 125, the first conductive pattern 121 and the second conductive pattern 122 that are sequentially stacked in a direction away from the base 11. As a result, side faces of the first conductive pattern 121 are indented inwardly relative to side faces of the second conductive pattern 122 and the third conductive pattern 125 to form depressions T.

In some embodiments, as shown in FIG. 17, the method further includes forming a source-drain pattern layer in a pixel driving circuit layer on the base 11 when the first conductive pattern 121, the second conductive pattern 122 and the third conductive pattern 125 are formed.

That is, the source-drain pattern layer is a stacked structure. The stacked structure includes a conductive sub-layer in the same layer as the first conductive pattern 121, another conductive sub-layer in the same layer as the second conductive pattern 122, and yet another conductive sub-layer in the same layer as the third conductive pattern 125. In this case, any conductive sub-layer in the source-drain pattern layer and a corresponding conductive pattern in the isolation portion 12 may be formed through the same patterning process.

Referring to FIG. 17, the source-drain pattern layer may include sources 191 and drains 192 of thin film transistors TFT. The source-drain pattern layer may further include data lines DL (referring to FIG. 5). A stacked structure of the source 191 and the drain 192 of the thin film transistor TFT and a stacked structure of the data line DL are similar to a stacked structure composed of the first conductive pattern 121, the second conductive pattern 122 and the third conductive pattern 125.

In some embodiments, the method further includes forming a buffer layer 18 and other layers in the pixel driving circuit layer on the base 11 before forming the isolation portion 12. The other layers include at least an active pattern layer, a gate insulating layer and a gate pattern layer.

The pixel driving circuit layer may include the plurality of pixel driving circuits 200 (referring to FIG. 5). For example, each pixel driving circuit 200 includes a plurality of thin film transistors TFT. As shown in FIG. 17, in addition to the source 191 and the drain 192 in the source-drain pattern layer, each thin film transistor TFT further includes a gate

193 in the gate pattern layer, a portion of the gate insulating layer 194, an active pattern 195 in the active pattern layer.

For example, the above thin film transistor TFT is a bottom-gate thin film transistor or a top-gate thin film transistor.

In a case where the thin film transistor TFT is the top-gate thin film transistor, the buffer layer 18 and the active pattern layer are sequentially formed on the base 11.

The buffer layer 18 may include a silicon nitride layer and a silicon oxide layer that are stacked. A thickness of the silicon nitride layer is approximately in a range from 0.3 μm to 0.7 μm, such as 0.3 μm, 0.4 μm, 0.5 μm, 0.6 μm, or 0.7 μm. A thickness of the silicon oxide layer is approximately in a range from 1.0 μm to 1.2 μm, such as 1.0 μm, 1.05 μm, 1.08 μm, 1.1 μm, or 1.2 μm. A material of the active pattern layer may include a polysilicon (p-Si) material, and a thickness of the active pattern layer may be approximately 0.05 μm.

Figure 18:
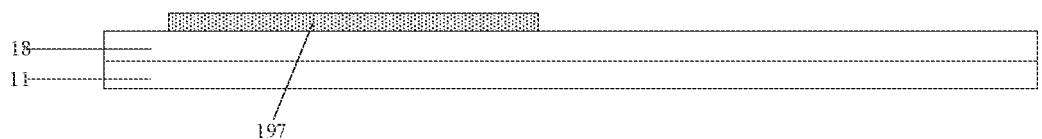
FIG. 18 is a schematic diagram illustrating yet another process of manufacturing a light-emitting substrate, in accordance with some embodiments.

For example, in a process of forming the active pattern layer, an amorphous silicon film is firstly formed, then the amorphous silicon film is dehydrogenated at a high temperature condition (e.g., the high temperature is in a range from 300° C. to 350° C.), the amorphous silicon film is crystallized by excimer laser annealing (ELA) to form a polysilicon film, and the polysilicon film is patterned to form the polysilicon pattern layer 197 including a plurality of silicon islands (as shown in FIG. 18).

By dehydrogenating the amorphous silicon film at the high temperature condition, a hydrogen explosion phenomenon may be prevented during the ELA.

It will be understood that, in the ELA process, excimer laser is used as a heat source, and after the laser passes through a projection system, a beam with uniform energy distribution is generated and projected on a substrate (i.e., the base 11), and amorphous silicon is transformed into polysilicon (p-Si) after absorbing the energy of the excimer laser.

For example, patterning the polysilicon film includes: forming a first photoresist layer on the polysilicon film; forming a silicon island mask by using a digital exposure machine or a mask to pattern the first photoresist layer; and then dry-etching the polysilicon film. For example, a mixed gas of carbon tetrafluoride ($CF_4$) and oxygen ($O_2$) may be used for dry etching.

After that, the silicon island mask is removed by wet stripping.

For example, the silicon islands are lightly doped by using phosphorane or borane, so as to reduce resistances of the silicon islands.

Figure 19:
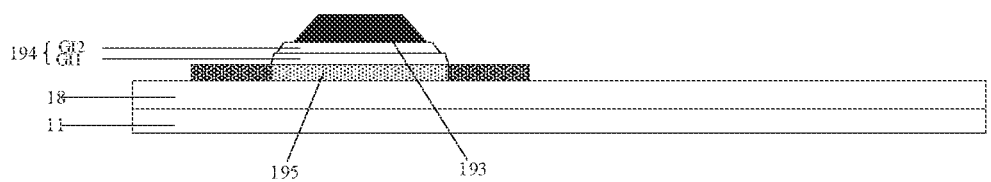
FIG. 19 is a schematic diagram illustrating yet another process of manufacturing a light-emitting substrate, in accordance with some embodiments.

Subsequently, as shown in FIG. 19, the date insulating layer 194 is formed. The gate insulating layer 194 may be a stacked structure of silicon oxide (SiO) and silicon nitride (SiN). For example, the gate insulating layer 194 includes a first gate insulating sub-layer GI1 and a second gate insulating sub-layer GI2 located on a side of the first gate insulating sub-layer GI1 away from the base 11. The first gate insulating sub-layer GI1 is made of silicon oxide, and the second gate insulating sub-layer GI2 is made of silicon nitride. A thickness of the first gate insulating sub-layer GI1 may be in a range from 0.03 μm to 0.06 μm, such as 0.03 μm, 0.04 μm, 0.05 μm, or 0.06 μm. A thickness of the second gate insulating sub-layer GI2 may be in a range from 0.05 μm to 0.09 μm, such as 0.05 μm, 0.06 μm, 0.07 μm, 0.08 μm, or 0.09 μm.

It will be noted that, the gate insulating layer 194 may be of a one-piece structure or may be include a plurality of gate insulating patterns that are spaced apart.

Then, a gate metal layer is formed. The gate metal layer may be made of metallic molybdenum. A thickness of the gate metal layer may be in a range from 0.25 μm to 0.3 μm, such as 0.25 μm, 0.26 μm, 0.27 μm, 0.28 μm, 0.29 μm, or 0.3 μm.

A second photoresist layer is formed on the gate metal layer, a gate mask may be formed by using a digital exposure machine or a mask to pattern the second photoresist layer, and then the gate metal layer is dry-etched to form the gate pattern layer. For example, a mixed gas of sulfur hexafluoride ($SF_6$) and $O_2$ may be used for dry etching. For another example, a mixed gas of high-flow $CF_4$ and low-flow $O_2$ may be used for dry etching, a flow of $CF_4$ may be in a range from 2000 sccm (standard cubic centimeter per minute) to 2500 sccm, and a flow of $O_2$ may be in a range from 1000 sccm to 1500 sccm.

After dry etching, portions of each silicon island to be ohmic contacted with the source 191 and the drain 192 are doped by performing a gate self-aligned process, so that the portions of the silicon island are conducted to form the active pattern 195. For example, phosphorane or borane is used for doping (e.g., heavily doping) the portions of the silicon island. In addition, a portion of the silicon island may also be conducted to serve as an electrode of the capacitor in the pixel driving circuit.

Based on this, the active pattern 195 includes a source portion, a drain portion, and a channel therebetween. The source portion and the drain portion are heavily doped, and electrically connect to the source 191 and the drain 192, respectively.

In addition, before heavily doping the source portion and the drain portion of the silicon island, a portion of the silicon island located between the channel portion and the source portion, and another portion of the silicon island located between the channel portion and the drain portion, may be moderate doped, so that leakage suppression portions of the active pattern are formed. In this case, a leakage current of the TFT may be reduced.

Afterwards, the gate mask is removed by wet etching.

Then, referring to FIG. 19, layers formed on the base 11 are annealed, so as to repair polysilicon and an inorganic layer damaged by ion doping. For example, an anneal temperature is in a range from 500° C. to 600° C.

Next, the interlayer insulating layer 196 is formed. The interlayer insulating layer 196 may be of a stacked structure composed of a SiO layer, a SiN layer and another SiO layer. A thickness of the SiO layers in an upper layer and a lower layer may be in a range from 0.15 μm to 0.25 μm, such as 0.15 μm, 0.16 μm, 0.18 μm, 0.2 μm, or 0.25 μm. A thickness of the SiN layer in an intermediate layer is in a range from 0.1 μm to 0.15 μm, such as 0.1 μm, 0.11 μm, 0.12 μm, 0.14 μm, or 0.15 μm.

Figure 20:
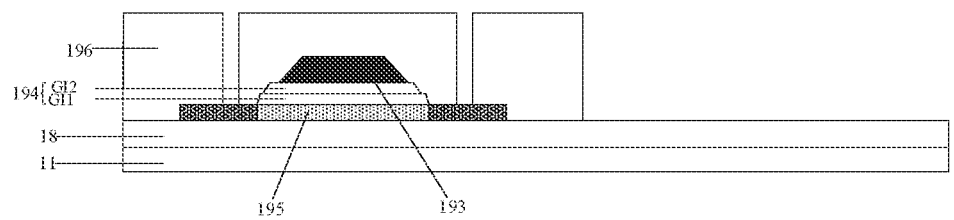
FIG. 20 is a schematic diagram illustrating yet another process of manufacturing a light-emitting substrate, in accordance with some embodiments.

Referring to FIG. 20, contact holes are formed through a photolithography process. In this case, in a subsequent process of forming the source 191 and the drain 192, the source 191 and the drain 192 are in contact with the source portion and the drain portion of the active pattern 195 through the contact holes, respectively.

In some embodiments, referring to FIGS. 3A, 3B, 6 and 7, the method further includes forming an encapsulation layer 17 on a side of the first conductive layer 13 away from the base 11. The encapsulation layer 17 is located in the light-emitting region A and the isolation region L. The encapsulation layer 17 may include inorganic insulating layer(s) and organic insulating layer(s). For example, the encapsulation layer 17 includes two inorganic insulating layers and an organic insulating layer between the two inorganic insulating layers.

For example, in an actual manufacturing process, a dam may be formed on the base 11 and in the frame area S. The dam may surround the light-emitting region A. The encapsulation layer 17 may extend from the light-emitting region A to a side of the dam proximate to the light-emitting region A. The encapsulation layer 17 may encapsulate the light-emitting devices to prevent moisture and oxygen from entering the first conductive layer 13 and the light-emitting functional pattern 141, thereby improving the encapsulation effect of the light-emitting substrate 1.

The foregoing descriptions are merely some specific implementation manners of the present disclosure, but the protection scope of the present disclosure is not limited thereto, and changes or replacements that any person skilled in the art could conceive of within the technical scope disclosed by the present disclosure shall be within the protection scope of the present disclosure. Therefore, the protection scope of the present disclosure shall be subject to the protection scope of the claims.

What is claimed is:

1. A light-emitting substrate having a light-emitting region and an isolation region located outside the light-emitting region, the light-emitting substrate comprising:
   a base;
   an isolation portion disposed on the base and located in the isolation region, wherein the isolation portion includes a first conductive pattern, a second conductive pattern and a first insulating pattern that are sequentially stacked on the base; an orthogonal projection of the first conductive pattern on the base is located within an orthogonal projection of the second conductive pattern on the base; and a side face of the first conductive pattern proximate to the light-emitting region and a corresponding side face of the second conductive pattern proximate to the light-emitting region have a first gap therebetween; and
   a second insulating pattern located in the light-emitting region, wherein the second insulating pattern and the first insulating pattern are arranged in a same layer; and a side face of the second insulating pattern proximate to the first insulating pattern and a side face of the first insulating pattern proximate to the second insulating pattern have a second gap therebetween,
   wherein at least one groove is provided on a surface of the first insulating pattern layer away from the base, and an extending direction of the at least one groove is approximately the same as an extending direction of the isolation portion.

2. The light-emitting substrate according to claim 1, further comprising a first conductive layer located in the light-emitting region and the isolation region, wherein the first conductive layer is located on a side of the second insulating pattern layer and the isolation portion away from the base, and the first conductive layer is disconnected on a side of the isolation portion proximate to the light-emitting region.

3. The light-emitting substrate according to claim 2, further comprising a light-emitting functional layer being closer to the base than the first conductive layer,
   wherein the light-emitting functional layer is located in the light-emitting region and the isolation region, and the light-emitting functional layer is disconnected on the side of the isolation portion proximate to the light-emitting region; or
   the light-emitting functional layer is located only in the light-emitting region, the light-emitting functional layer includes a plurality of light-emitting functional patterns that are spaced apart; and orthogonal projections of the plurality of light-emitting functional patterns on the base is located within an orthogonal projection of the second insulating pattern on the base.

4. The light-emitting substrate according to claim 3, further comprising a pixel defining layer disposed between the second insulating pattern and the first conductive layer and located in the light-emitting region, wherein the pixel defining layer includes a plurality of first openings, and a portion of the light-emitting functional layer is disposed in each opening.

5. The light-emitting substrate according to claim 4, wherein the pixel defining layer is made of lyophobic material.

6. The light-emitting substrate according to claim 1, wherein in a direction perpendicular to the extending direction of the isolation portion, a width of each groove is in a range from 4 µm to 6 µm.

7. The light-emitting substrate according to claim 1, wherein the at least one groove includes at least two grooves, and the at least two grooves are sequentially arranged in a direction perpendicular to the extending direction of the isolation portion.

8. The light-emitting substrate according to claim 1, wherein the light-emitting substrate further has a frame region located outside the isolation region, and further includes:
   a plurality of pixel driving circuits disposed on the base and located in the light-emitting region; and
   a gate driving circuit disposed on the base and located in the frame region, the gate driving circuit being coupled to the plurality of pixel driving circuits.

9. The light-emitting substrate according to claim 8, further comprising a plurality of gate lines disposed on the base, and being coupled to the gate driving circuit and the plurality of pixel driving circuits,
   wherein the isolation portion has a second opening, and the plurality of gate lines pass through the second opening of the isolation portion to be coupled to the gate driving circuit.

10. A light-emitting apparatus, comprising:
    the light-emitting substrate according to claim 1; and
    a driving circuit coupled to the light-emitting substrate, the driving circuit being configured to drive the light-emitting substrate to emit light.

11. A method of manufacturing a light-emitting substrate, comprising:
    sequentially forming a first conductive pattern and a second conductive pattern that are located in an isolation region on a base, wherein an orthogonal projection of the first conductive pattern on the base is located within an orthogonal projection of the second conductive pattern on the base, and a side face of the first conductive pattern proximate to a light-emitting region and a corresponding side face of the second conductive pattern proximate to the light-emitting region have a first gap therebetween; the isolation region is located outside the light-emitting region;
    forming an insulating film on the base on which the first conductive pattern and the second conductive pattern have been formed;
    patterning the insulating film to form a second insulating pattern located in the light-emitting region, an etching barrier pattern located in first gap and an insulating pattern portion located on the second conductive pattern, wherein the second insulating pattern and the etching barrier pattern have a third gap therebetween; and removing the etching barrier pattern and a portion of the insulating pattern portion to form a first insulating pattern located on the second conductive pattern, so as to form an isolation portion including the first conductive pattern, the second conductive pattern and the first insulating pattern, wherein a side face of the second insulating pattern proximate to the first insulating pattern and a side face of the first insulating pattern proximate to the second insulating pattern have a second gap therebetween, wherein a surface of the insulating pattern portion away from the base has at least one initial groove, and a surface of the first insulating pattern away from the base has at least one groove.

12. The method according to claim 11, wherein the insulating film is made of photoresist; and removing the etching barrier pattern and the portion of the insulating pattern portion, includes:

removing the etching barrier pattern and the portion of the insulating pattern portion through an ashing process.

13. The method according to claim 12, wherein before removing the etching barrier pattern and the portion of the insulating pattern portion, the method further comprises:

forming a conductive film on the base on which the first conductive pattern, the second conductive pattern, the second insulating pattern, the insulating pattern portion, and the etching barrier pattern have been formed; and etching the conductive film by using an etching solution to form a plurality of electrodes.

14. The method according to claim 13, further comprising:

forming a photoresist film on the base on which the plurality of electrodes have been formed before removing the etching barrier pattern and the portion of the insulating pattern portion;

patterning the photoresist film through an exposure process and a development process to form a photoresist retention pattern located in the light-emitting region; and removing a portion of the photoresist retention pattern to form a pixel defining layer including a plurality of first openings when the etching barrier pattern is removed through the ashing process, wherein an orthogonal projection of each first opening on the base and an orthogonal projection of a corresponding electrode on the base are overlapped.

15. The method according to claim 14, wherein before removing the etching barrier pattern and the portion of the insulating pattern portion, the method further comprises:

developing a portion of the etching barrier pattern when the photoresist film is developed, wherein a duration of developing the portion of the etching barrier pattern is greater than a duration of developing the photoresist film.

16. The method according to claim 14, further comprising:

forming a light-emitting functional layer located in the light-emitting region and the isolation region on the base on which the pixel defining layer has been formed, wherein a portion of the light-emitting functional layer is located in each first opening, and the light-emitting functional layer is disconnected on a side of the isolation portion proximate to the light-emitting region; or forming a light-emitting functional layer located only in the light-emitting region on the base on which the pixel defining layer has been formed, wherein the light-emitting functional layer includes a plurality of light-emitting functional pattern that are spaced apart, each light-emitting functional pattern is located in one first opening, and orthogonal projections of the plurality of light-emitting functional patterns on the base are located within an orthogonal projection of the second insulating pattern on the base.

17. The method according to claim 16, further comprising forming a first conductive layer on a side of the light-emitting functional layer away from the base located in the light-emitting region and the isolation region, wherein the first conductive layer is disconnected on a side of the isolation portion proximate to the light-emitting region.

\* \* \* \* \*